United States Patent
Harris et al.

(10) Patent No.: US 7,934,898 B2
(45) Date of Patent: *May 3, 2011

(54) HIGH THROUGHPUT SEMICONDUCTOR WAFER PROCESSING

(75) Inventors: Randy A. Harris, Kalispell, MT (US); Steve L. Eudy, Kalispell, MT (US); Paul Z. Wirth, Whitefish, MT (US)

(73) Assignee: Semitool, Inc., Kalispell, MT (US)

( * ) Notice: Subject to any disclaimer, the term of this patent is extended or adjusted under 35 U.S.C. 154(b) by 850 days.

This patent is subject to a terminal disclaimer.

(21) Appl. No.: 11/778,576

(22) Filed: Jul. 16, 2007

(65) Prior Publication Data

US 2009/0024244 A1 Jan. 22, 2009

(51) Int. Cl.
*B65B 69/00* (2006.01)

(52) U.S. Cl. ........................................ 414/411; 414/940

(58) Field of Classification Search .................. 414/411, 414/940

See application file for complete search history.

(56) References Cited

U.S. PATENT DOCUMENTS

| | | | |
|---|---|---|---|
| 5,378,145 A | 1/1995 | Ono et al. | |
| 5,544,421 A | 8/1996 | Thompson et al. | |
| 5,660,517 A | 8/1997 | Thompson et al. | |
| 6,030,208 A | 2/2000 | Williams et al. | |
| 6,579,052 B1 * | 6/2003 | Bonora et al. | 414/222.01 |
| 6,672,820 B1 | 1/2004 | Hanson et al. | |
| 6,900,132 B2 | 5/2005 | Thompson et al. | |
| 7,100,340 B2 * | 9/2006 | Bonora et al. | 248/672 |
| 7,101,138 B2 * | 9/2006 | Fosnight et al. | 414/222.11 |
| 7,114,903 B2 * | 10/2006 | Harris et al. | 414/222.01 |
| 7,371,306 B2 * | 5/2008 | Davis et al. | 156/345.22 |
| 7,520,286 B2 * | 4/2009 | Davis et al. | 134/166 R |
| 7,604,449 B1 * | 10/2009 | Kaveh | 414/411 |
| 7,743,728 B2 * | 6/2010 | Ishikawa et al. | 118/503 |
| 2005/0034977 A1 | 2/2005 | Hanson et al. | |
| 2005/0035046 A1 | 2/2005 | Hanson et al. | |
| 2005/0061438 A1 | 3/2005 | Davis et al. | |
| 2005/0063798 A1 | 3/2005 | Davis | |
| 2005/0232734 A1 * | 10/2005 | Elliott et al. | 414/411 |
| 2008/0187414 A1 * | 8/2008 | Elliott et al. | 414/217.1 |

OTHER PUBLICATIONS

Fosnight, William and Hofmeister, Christopher, "Searching for Greater Fab Productivity with 300mm Prime," Solid State Technology (Jul. 2006).

* cited by examiner

*Primary Examiner* — Saúl J Rodríguez
*Assistant Examiner* — Joshua I Rudawitz
(74) *Attorney, Agent, or Firm* — Kenneth H. Ohriner; Perkins Coie LLP

(57) ABSTRACT

A wafer processing system has a wafer loading system accommodating sufficient wafer carriers to substantially maximize the processing speed capability of the processing system. Wafer carriers are placed into and removed from the loading system by one or two overhead carrier loading tracks. Carriers may be loaded or removed while other carriers are in work. One or more transfer robots may move wafers from the carriers to buffers. One or more process robots in a process module move wafers from buffers, or other locations, to processors in the process module.

8 Claims, 21 Drawing Sheets

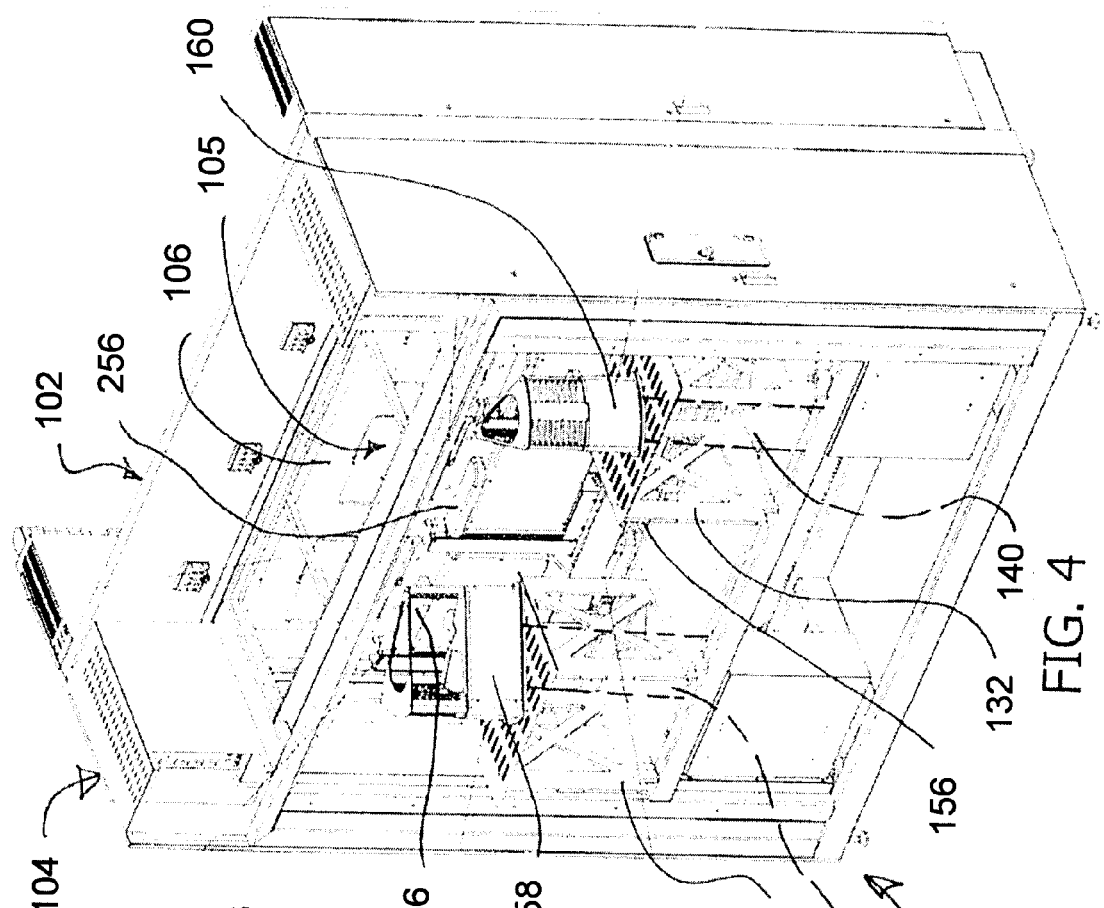
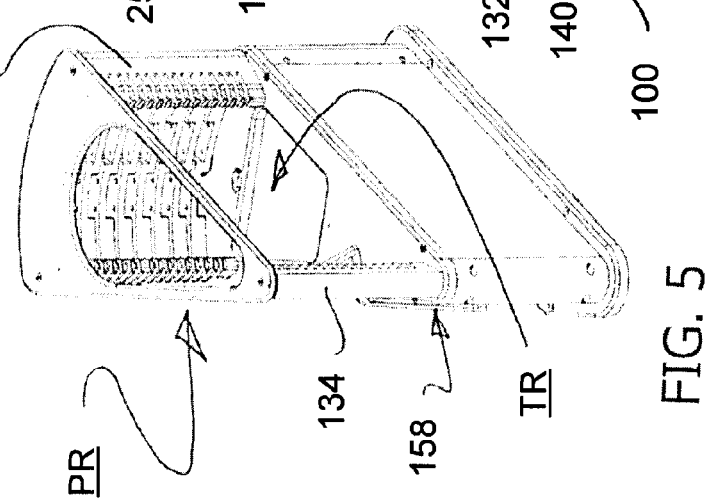
FIG. 4
FIG. 5

SCARA Transfer Module / 2 Robot Process Module

SCARA Transfer Module / SCARA Process Module

Five-Wafer End Effector, Dual Arm, Single WIP Robot, 12-Chamber AcceleRAIDER

1 Robot Transfer Module / 2 Robot Process Module

FIG. 14
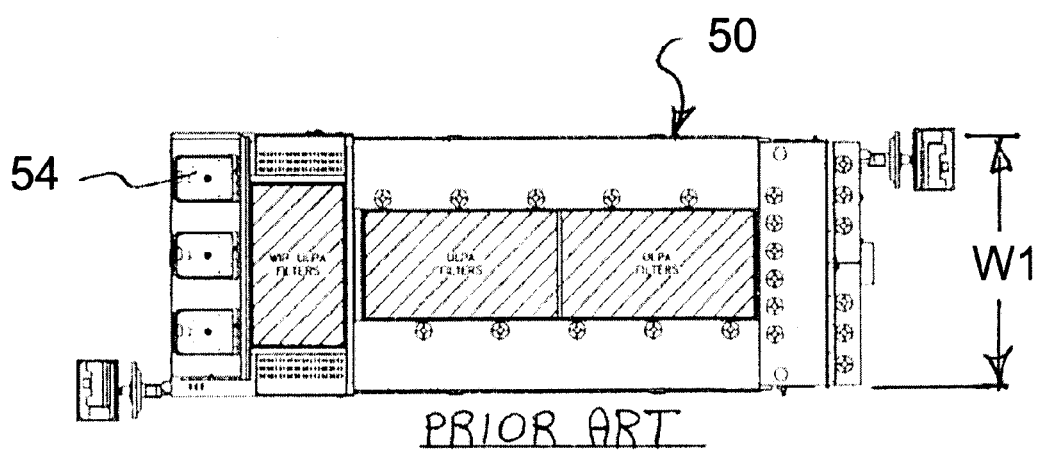
PRIOR ART
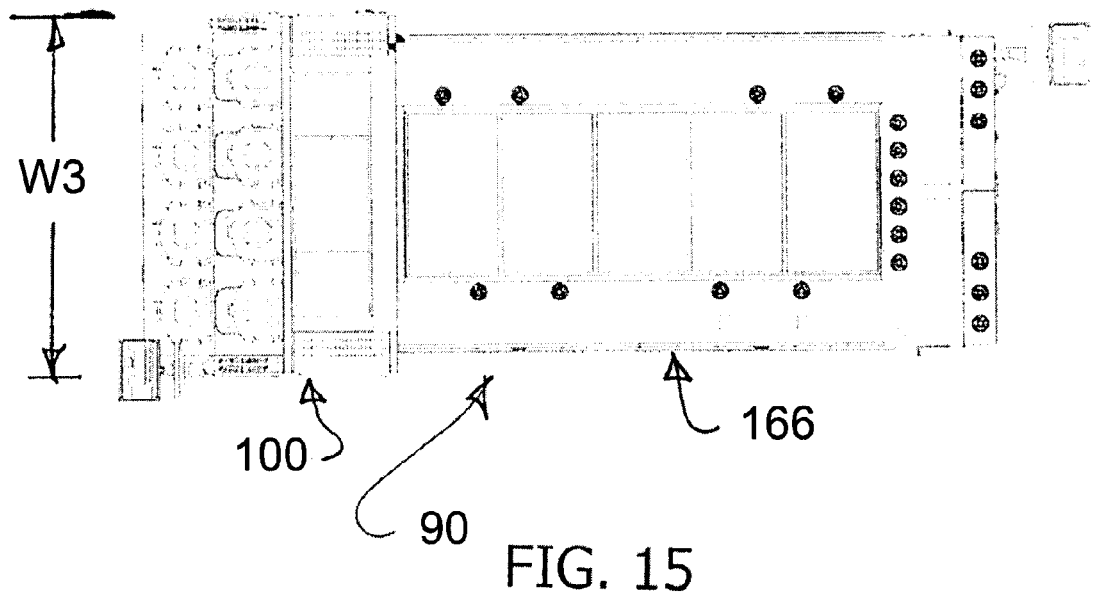
FIG. 15

FIG. 17              8 FOUP Shuttle Module

8 FOUP Swap Pattern

FIG. 19  8 FOUP Swap Pattern Module

FIG. 21  8 FOUP Access Pattern Module

8 FOUP Stacked Pattern Module

HIGH THROUGHPUT SEMICONDUCTOR WAFER PROCESSING

BACKGROUND OF THE INVENTION

The semiconductor manufacturing industry has achieved remarkable success in reducing manufacturing costs. As a result, the cost of most electronic products continues to drop, even as these products provide ever greater capabilities and value. In the past, some of the lower manufacturing costs have been achieved by running large lots of wafers in large batch processing machines. However, the semiconductor manufacturing industry is now tending to move away from batch processing and toward single wafer processing. Consequently, techniques for speeding up single wafer processing are needed.

A significant productivity challenge in semiconductor device manufacturing is process waiting time. For every minute that a micro-electronic substrate or wafer undergoes processing, the wafer may be completely idle for 20-30 minutes or more, while waiting for the next process to begin. Cycle-time is the total time required for a wafer to move through the entire manufacturing process. Reducing cycle time can allow device manufacturers flexibility to adapt product type to rapidly changing market demands. Wafer lot size is the size of the lot or batch of wafers moving as a group through the manufacturing processes. Currently, a common wafer lot size is 25, i.e., the wafers move through the manufacturing facility or fab in groups of 25 (typically within a carrier capable of holding up to 25 wafers). At each tool or station, the carrier must wait until the entire lot of e.g., 25 wafers is processed. If, on the other hand, the lot size is reduced to say 5 wafers, waiting time and cycle time can be significantly reduced. The overall inventory of wafers moving through the fab can also be reduced. Both of these factors reduce manufacturing costs.

Although reducing wafer lot sizes from 25 wafers per carrier to say five wafers per carrier may conceptually be a relatively simple transition, in the real world it creates difficult engineering challenges. Going from 25 to 5 wafers per carrier requires moving the same number of wafers through the fab, but using five times more individual carrier movements. Apart from simply moving carriers faster, other factors, such as carrier storage and waiting locations, carrier access, carrier movement patterns, etc. can affect ultimate manufacturing costs.

In addition, even with current technology, when specific process times are relatively short, say for example, less than 2 or 3 minutes per wafer, the processing systems can often process wafers more quickly than the wafer transport systems in the fab can deliver wafers to the processing systems. Consequently, the processing systems are often processing wafers at rates below their maximum processing capability. As a result, manufacturers are not able to achieve all of cost savings that such processing systems can offer.

Accordingly, improved systems and methods are needed.

SUMMARY OF THE INVENTION

A wafer processing system has a wafer loading system accommodating sufficient wafer carriers to substantially maximize the processing speed capability of the processing system. The loading system also allows for operation with carriers having smaller numbers of wafers, to reduce waiting time during manufacturing. Wafer carriers are placed into and removed from the loading system by one or two overhead carrier loading tracks. Carriers may be loaded or removed while other carriers are in work. Larger numbers of carriers may also be simultaneously accessed. The wafer loading system may be used with existing processing systems, to increase manufacturing efficiency.

This summary is included to provide a brief overview of the invention. However, the features and advantages described here are not requirements or limitations on the invention, and should not be taken as such. Rather, the limitations of the invention are set forth in the claims.

BRIEF DESCRIPTION OF THE DRAWINGS

In the drawings, wherein the same reference number indicates the same element in each of the views:

FIG. 4 is a rear perspective view of the loading system shown in FIG. 3.

FIG. 5 is a perspective view of one of the buffers shown in FIG. 4.

FIG. 14 is a plan view of the system shown in FIG. 2.

FIG. 15 is a plan view, drawn at the same scale as FIG. 14, of the system shown in FIG. 6, 8, or 10.

DETAILED DESCRIPTION OF THE DRAWINGS

Figure 1:
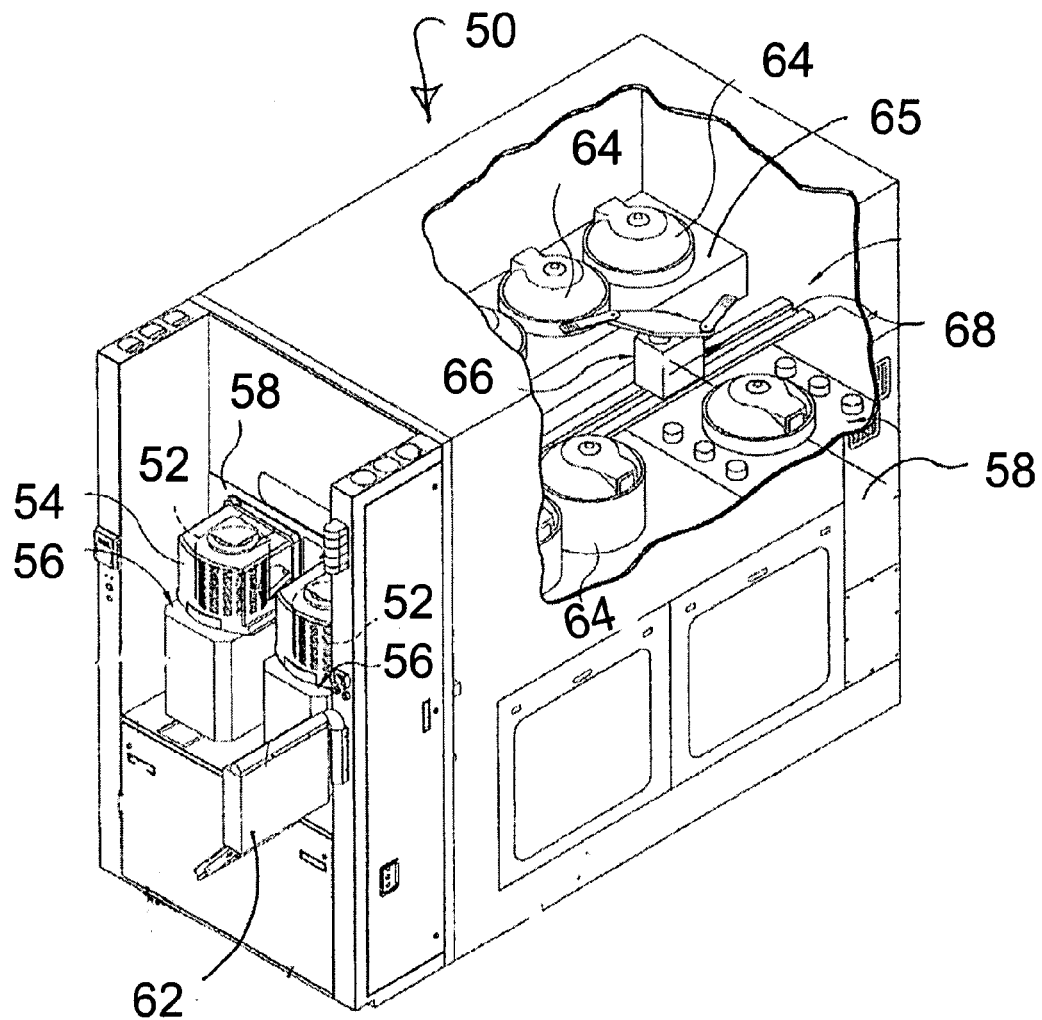
FIG. 1 is a perspective view of a prior art processing system.
Figure 2:
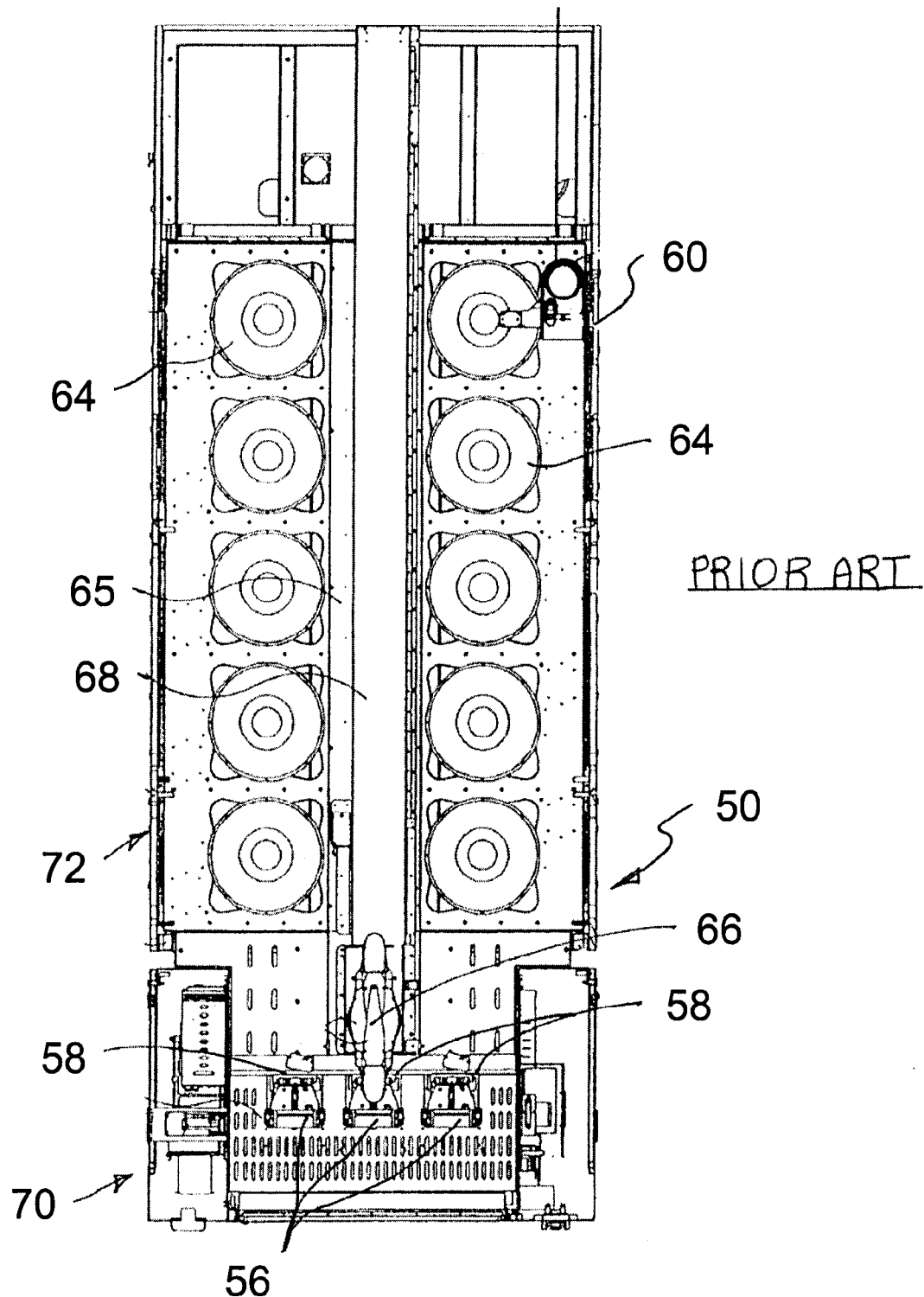
FIG. 2 is a top view looking down through the enclosure of a prior art system similar to the system shown in FIG. 1.
Figure 3:
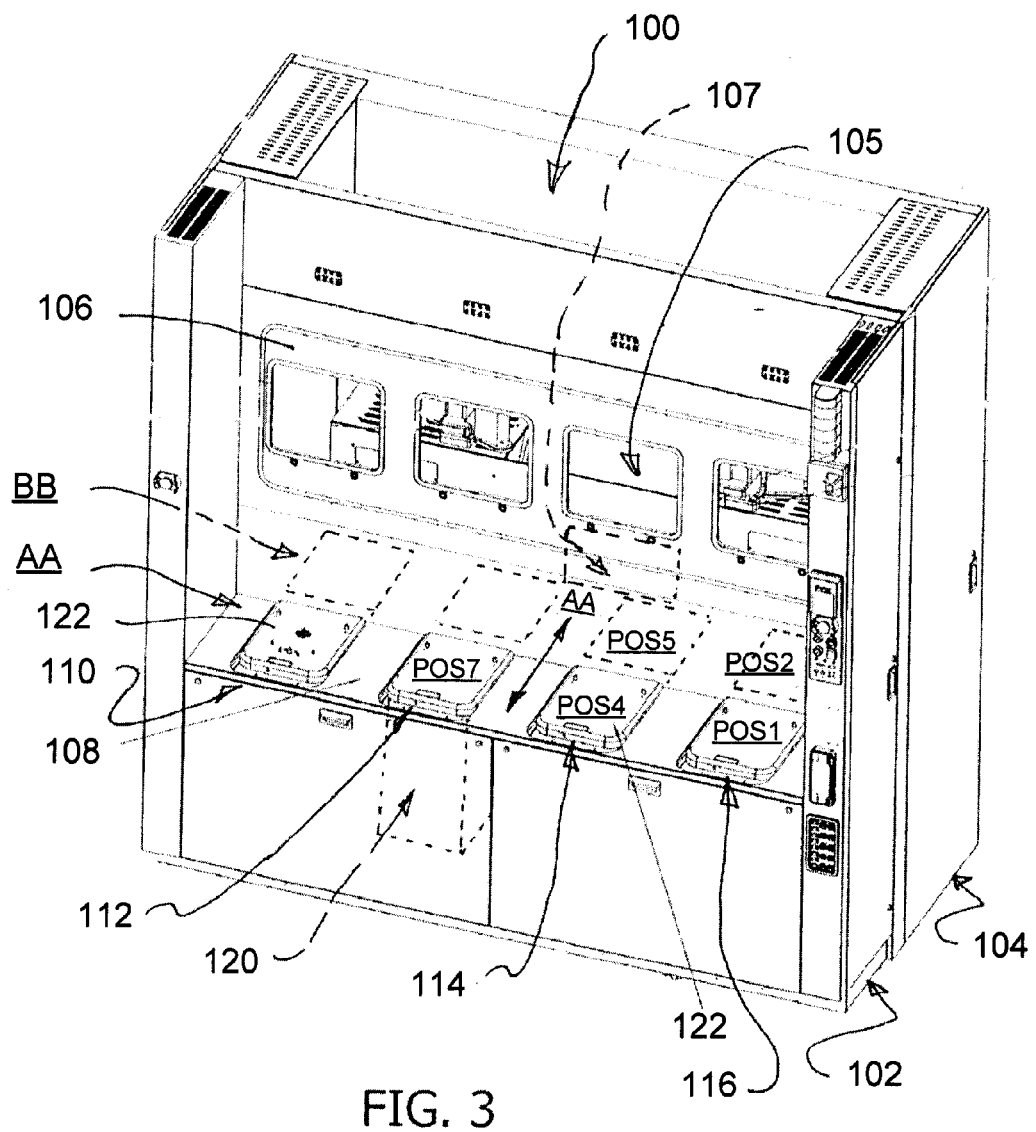
FIG. 3 is a front perspective view of a novel loading system, which may be used with the processing system shown in FIG. 1.

Turning now in detail to the drawings, as shown in FIGS. 1 and 2, in an existing processing system 50, wafers 52 are provided within containers 54 on loaders 56. The system 50 in FIG. 1 can handle two containers at a time, while the system shown in FIG. 3 is set up to handle three containers at a time. The containers or carriers 54 may be, and are referred to here, as front opening uniform pods (FOUPs), although other carriers or containers may also be used. The loaders 56 move the containers 54 to a docking wall 58. A container door remover within the system 50 removes the door from the container, allowing access to the wafers 52 within the containers 54.

The processing system 50 includes a deck 65 within an enclosure 60. Multiple processors 64 are arranged in two columns on the deck 65. A process robot 66 is movable along a track 68 between the processors 64. The process robot 66 moves wafers 52 from the containers 54 into the processors 64, and then back into the containers 54, after processing is complete. A controller 62 may be provided at either end of the process system 50. The processing system 50 may be designed and operated as described in U.S. Pat. Nos. 6,900,132; 6,350,319; 6,264,752, each incorporated herein by reference.

Turning to FIGS. 3 and 4, a new loading system 100 is provided for use with processing systems, such as the system 50 shown in FIGS. 1 and 2. Referring to FIG. 3, the loading system 100 has a container (FOUP) module 102 and a wafer transfer module 104. The FOUP module 102 has FOUP plates 122 generally at the vertical level of a loading deck 108. The plates 122 have fittings for receiving and holding a FOUP container 54 or a similar container. Each of the four plates 122 is supported on a shuttle actuator 120 adapted to move the plate 122 linearly in the direction of arrow AA in FIG. 3. The plates 122 are typically evenly spaced apart and define FOUP loading columns or aisles shown as 110, 112, 114 and 116.

Referring still to FIGS. 3 and 4, the FOUP module 102 includes a docking wall 106 with a docking opening 105 in the wall 106 at each of the FOUP columns 110, 112, 114 and 116. A FOUP door remover 256 is associated with each docking opening 105. Buffers 158 and 160 are supported on buffer platforms 132, so that the buffers are at a convenient vertical position. As shown in FIG. 5, each of the buffers includes a slotted post 134 spaced apart from a slotted curved wall 136, providing multiple spaced apart wafer holding positions.

Figure 6:
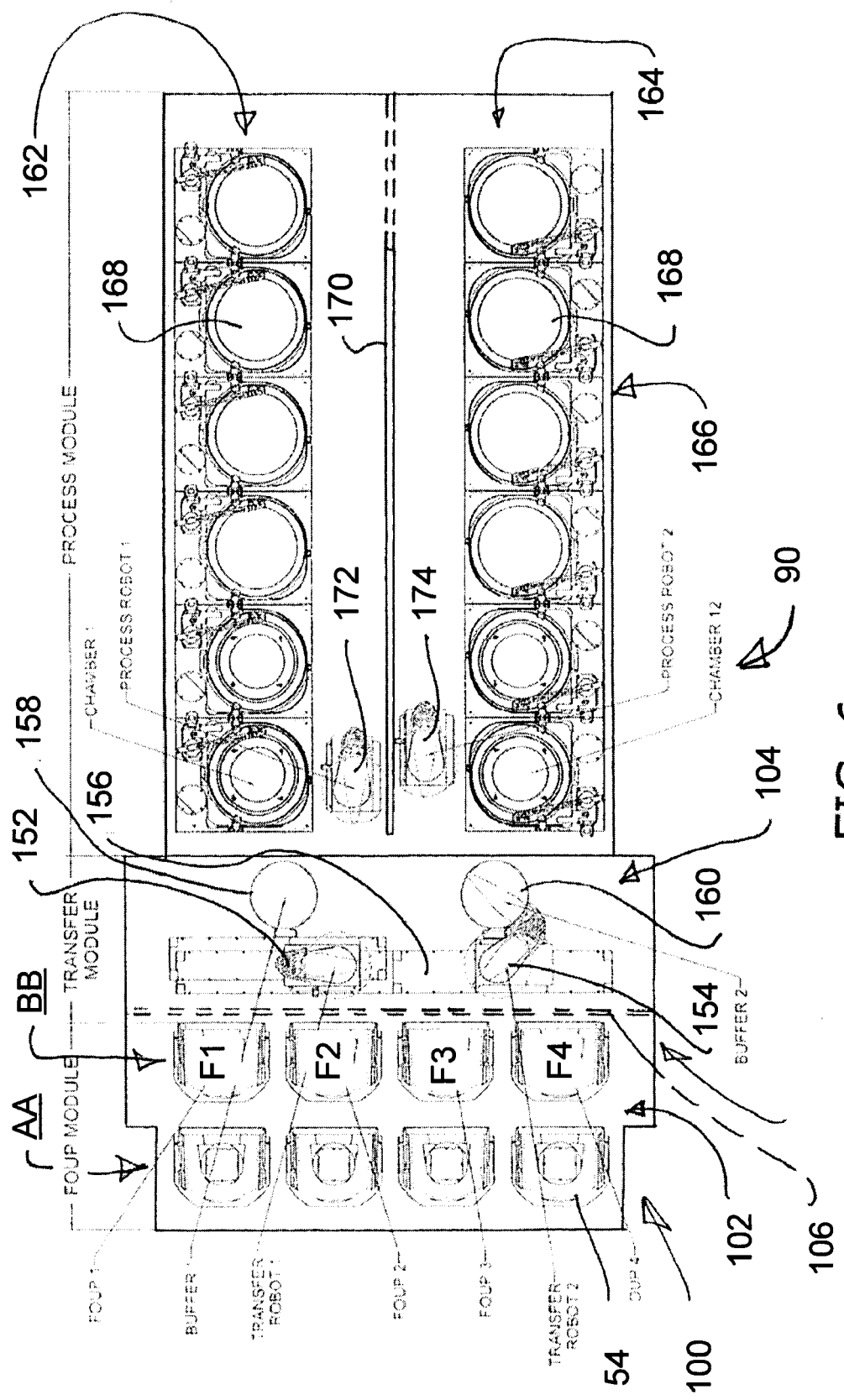
FIG. 6 is a plan view of the loading system used with a processing system similar to, or the same as, the processing system shown in FIGS. 1 and 2.

Turning to FIG. 6, the loading system 100 is shown attached to a process module 166 to form a processing system 90. In this design, a first transfer robot 152 moves wafers between FOUP 1 and FOUP 2 (designated as F1 and F2 in FIG. 6) at the docking wall 106 and the first buffer 158. A second transfer robot 154 similarly moves wafers between FOUP 3 and FOUP 4 (designated as F3 and F4 in FIG. 6) at the docking wall 106 and the second buffer 160.

The process module 166 shown in FIG. 6 has a first section 162, a second section 164, and a divider wall 170 separating the first and second sections. The divider wall 170 may extend the full length and height of the process module 166, to substantially isolate the first section 162 from the second section 164. Each of the sections 162 and 164, as shown in FIG. 6, includes an array of wafer processors 168. A first process robot 172 in the first section 162, and a second process robot 174 in the second section 164, are movable along rails, to allow each process robot to access each of the processors in its section. The processors 168 may be set up to perform various wafer processing steps including cleaning, rinsing and/or drying, electroplating, annealing, etc. for example as described in U.S. patent application Ser. No. 11/620,508, incorporated herein by reference.

Figure 7:
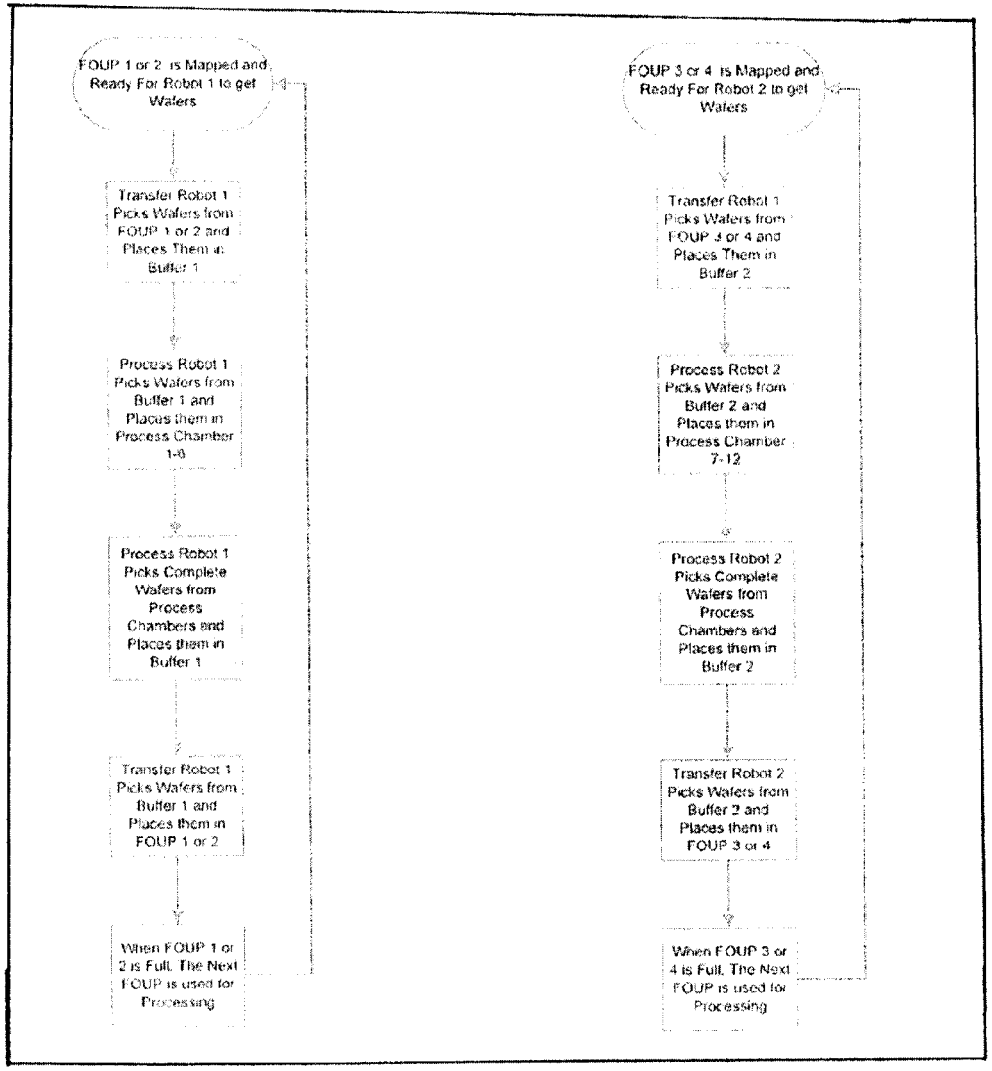
FIG. 7 is a diagram indicating operation of the system shown in FIG. 6.

FIG. 7 illustrates operation of the processing system 90 shown in FIG. 6. In this operation, the first process robot 172 picks up one or more wafers from the first buffer 158 and delivers them to the processors 168 in the first section 162. Within a processor 168, the wafer is typically rotated, while one or more process liquids or gases are applied onto the wafer, in a spin/spray method. The wafer may then be dried within the processor.

After processing, the wafers are then returned to the first buffer 158 by the first process robot 172. The first transfer robot 152 then moves the now processed wafers from the first buffer 158 back into FOUP 1 and/or FOUP 2. Operation of the second side 164 is the same as, but independent of, the first section 162. As each section 162 and 164 of the process module 166 operates independently, the speed of operation of either section is independent of the other. In addition, either section may be idled, for example, for service or calibration, while the other section continues with normal processing operations. The processors 168 on each section 162 and 164 may share common process fluid supplies, electrical power supplies, and drain/exhaust connections (all typically provided underneath the deck holding the processors 168), or they may each have independent supplies or connections.

Figure 8:
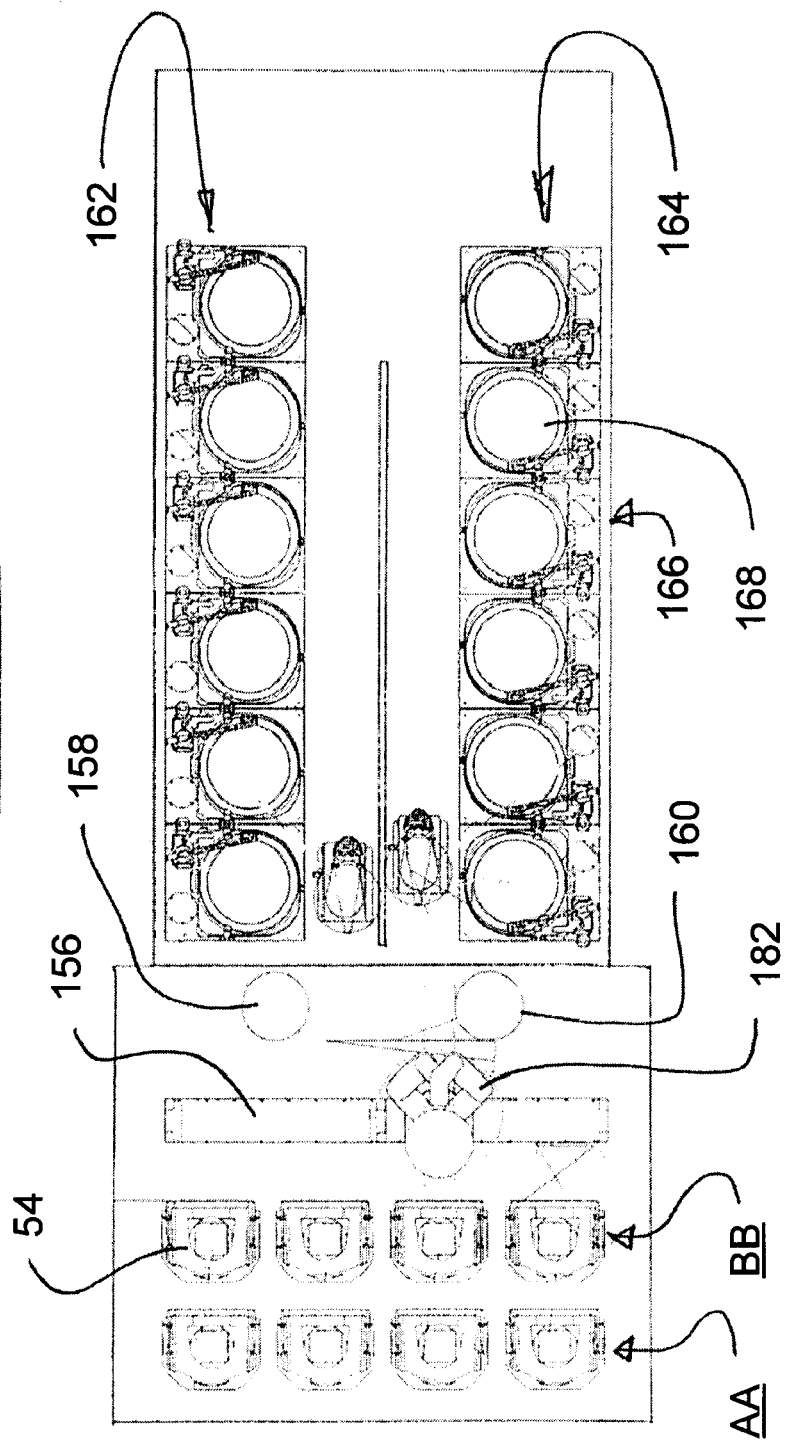
FIG. 8 is a plan view of a processing system, similar to the system shown in FIG. 6, and having an alternative novel loading system design.

FIG. 8 shows a processing system 92 similar to the system 90 shown in FIG. 6, and having the same process module 166 as shown in FIG. 6, combined with a loading system 180 having a single selective compliant assembly robot arm (SCARA) transfer robot 182. The robot 182 has two articulated arms, which may share a common rotation axis. The robot 182 is shown moveable along a track 156. However, this type of robot may alternatively be mounted at a fixed location, with all necessary movements achieved via the multiple degrees of freedom of the articulated arms. Vertical movements may be achieved via an elevator at the shoulder or base of the arm.

Figure 9:
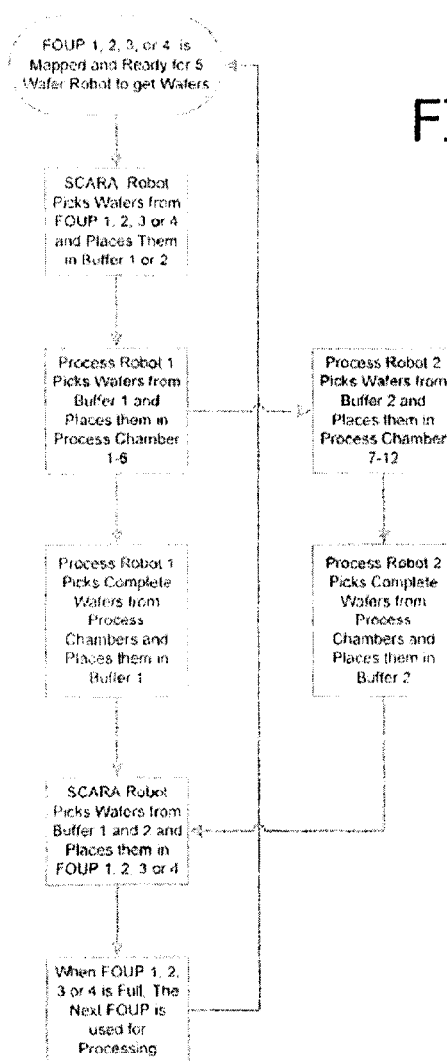
FIG. 9 is a block diagram indicating operation of the system shown in FIG. 8.

FIG. 9 is a block diagram showing operation of the system shown in FIG. 8. The robot 182 picks wafers from FOUP 1, 2, 3 or 4 and places them in either buffer 158 or buffer 160. The first process robot 172 then moves wafers from the first buffer 158 into the process chambers 168 in the first side or section 162 of the process module 166. Similarly, the second process robot 174 moves wafers from the second buffer 160 to processors 168 on the second side or section 164 of the process module 166. Operation of the processing system 92 may accordingly be the same as in the system 90 shown in FIG. 6, except that the single SCARA transfer robot transfers the wafers between the FOUPs and the buffers, instead of the two end to end transfer robots shown in FIG. 6.

Figure 10:
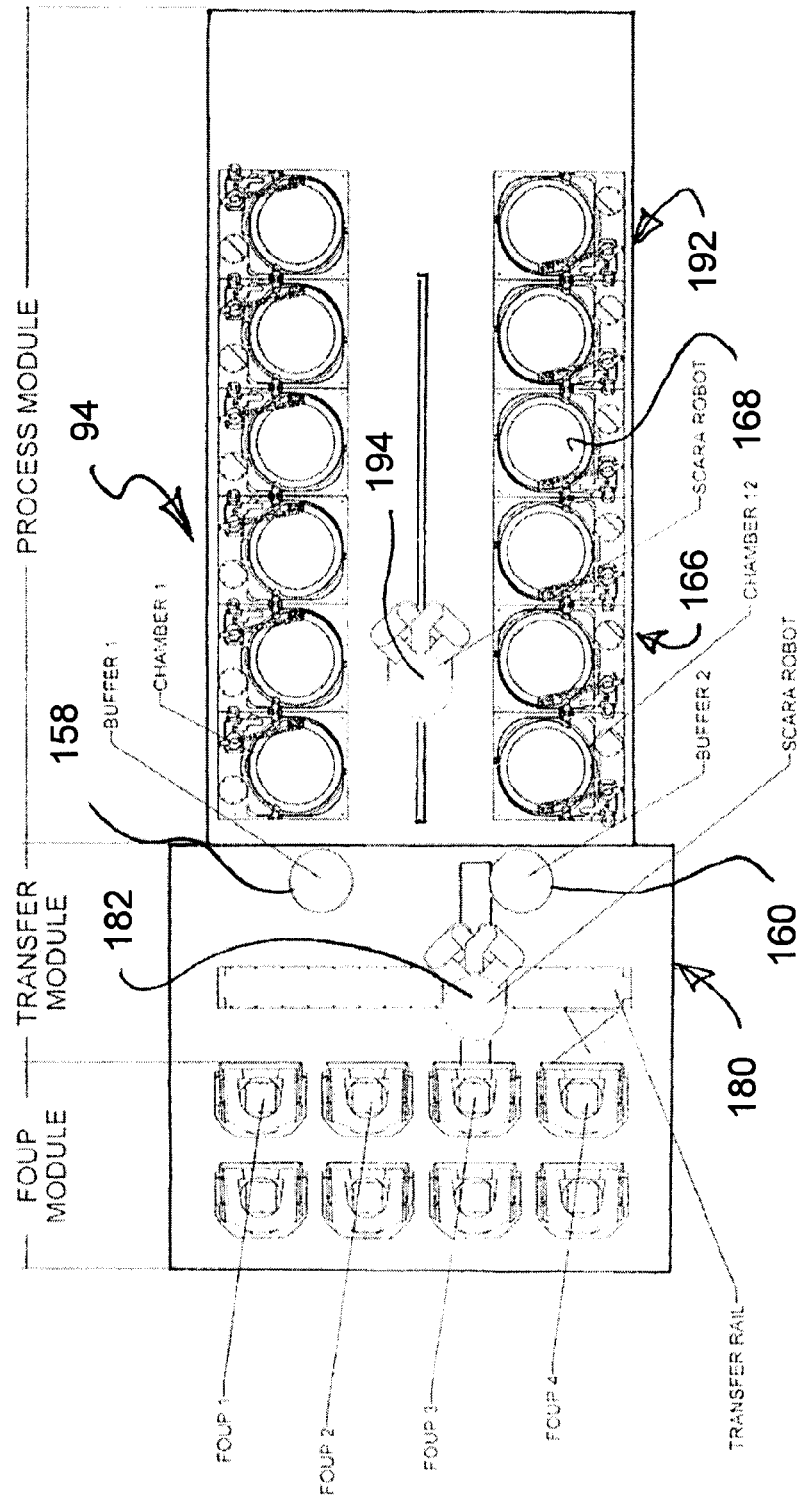
FIG. 10 is a plan view of a processing system similar to the system shown in FIG. 8, and having an alternative process robot design.
Figure 11:
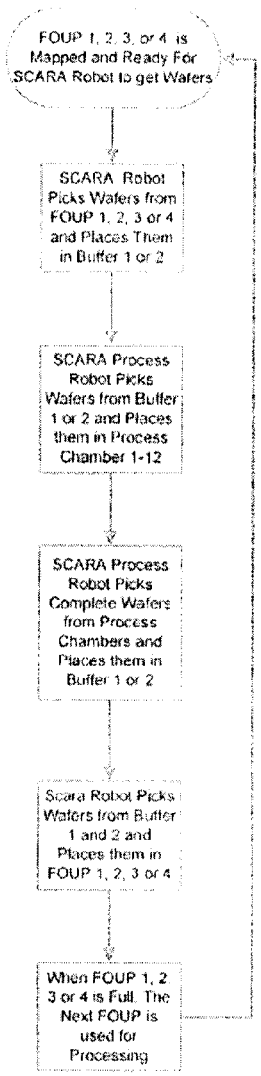
FIG. 11 is a block diagram indicating operation of the system shown in FIG. 10.

FIG. 10 shows another alternative processing system 94 having the same loading system 180 and process module 166 as shown in FIG. 8 (including a single SCARA transfer robot 182.) However, in the processing system 94, the process module 166 includes a single SCARA process robot 194, rather than the two process robots 172 and 174 shown in FIGS. 6 and 8. Since the single process robot 194 must load and unload wafers into and out of all of the processors 168, there is no divider wall 170 in this design. As illustrated in FIG. 11, in the processing system 94 of FIG. 10, the single SCARA transfer robot 182 moves wafers between FOUPs 1, 2, 3, and 4, and both buffers 158 and 160. Similarly, the single SCARA process robot 194 moves wafers between both buffers 158 and 160, and each of the processors 168 in the process module 166.

Figure 12:
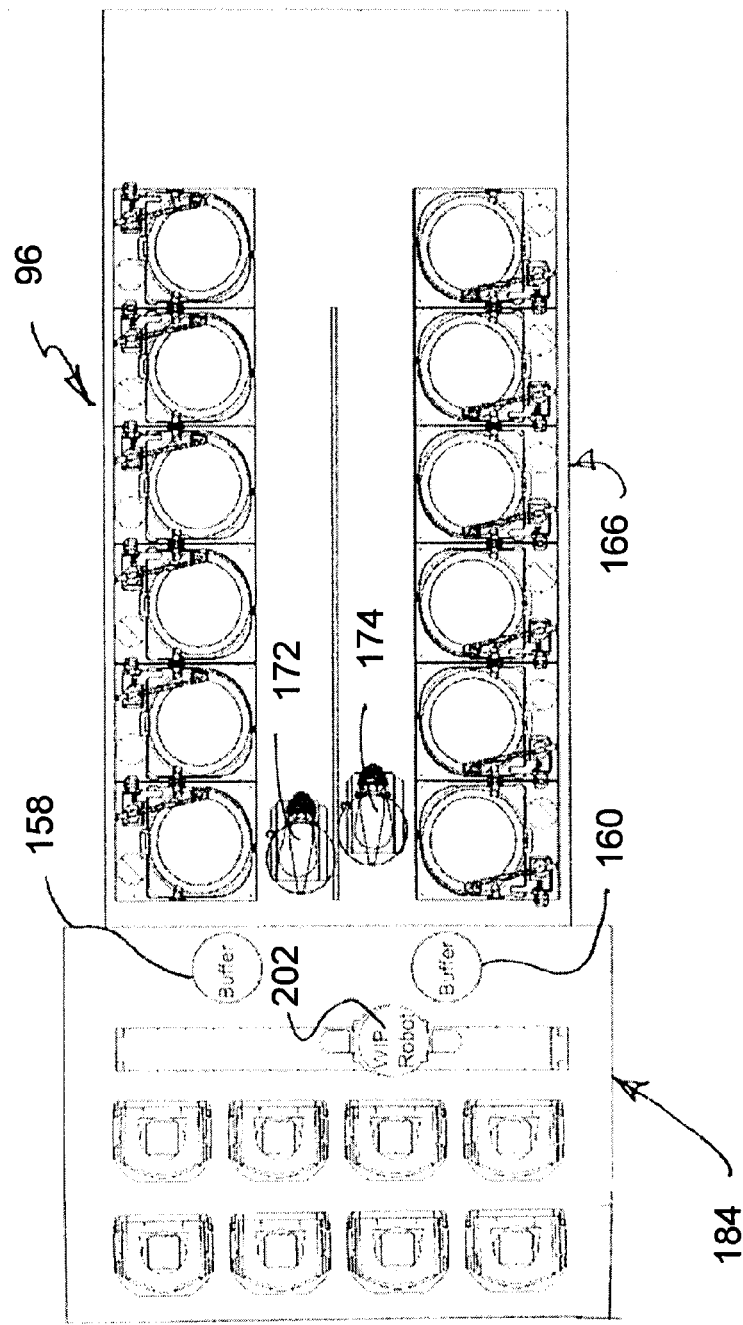
FIG. 12 is a plan view of a processing system similar to the system shown in FIG. 6, and having an alternative loading system design.
Figure 13:
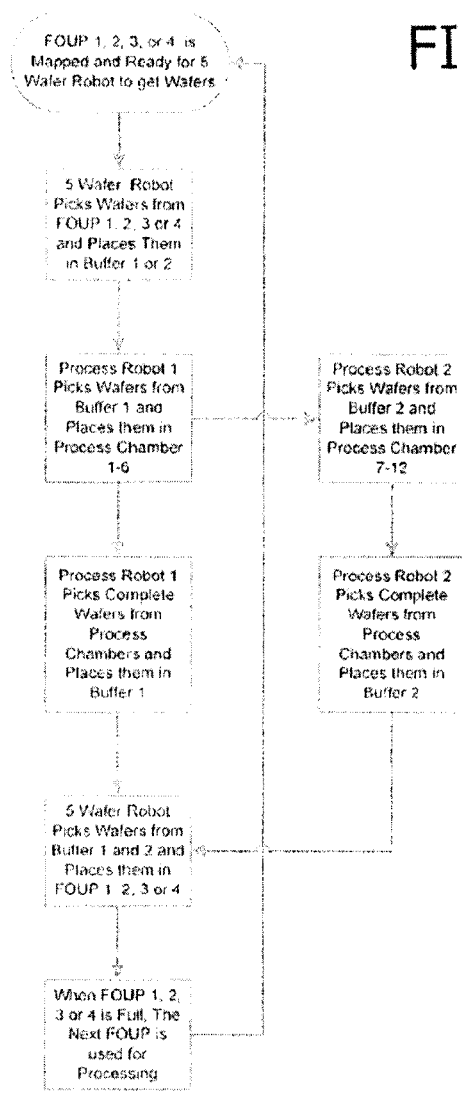
FIG. 13 is a block diagram indicating operation of the system shown in FIG. 12.

FIG. 12 shows another alternative processing system 96 having a loading system 184 similar to the system shown in FIG. 8, but with a transfer robot 202 having a five-wafer end effector. In this design the transfer robot 202 can move up to five wafers, in a single movement sequence, to or from FOUPs 1, 2, 3 or 4, and buffers 158 and 160. The process module 166, as shown in FIG. 12, is the same as the process modules shown in FIGS. 6 and 8. As described in FIG. 13, the process robots 172 and 174 move a single wafer at a time, while the transfer robot 202 can move up to five wafers at a time into and out of the buffers 158 and 160.

Referring to FIGS. 4 and 5, the buffer 130 has a generally wedge-shaped design. The transfer robots move wafers into and out of the buffer 130 through the front opening labeled TR in FIG. 5. The process robots move wafers into and out of the buffer 130 through the rear opening labeled PR in FIG. 5. The buffers 130 provide temporary holding positions for the wafers. The generally wedge-shaped buffers 130 allow the robots to pick up and place wafers in the buffers, relatively quickly and with relatively simple movements. Of course, other types of buffers having different forms and locations may be used. Indexing buffers having vertical movement may also be used. By moving the buffers (or rather the buffer shelves providing the wafer holding positions) vertically, buffer capacity may increase within a compact space. The amount of vertical robot movement may also be reduced, allowing the robots to pick and place wafers more quickly. Vertically indexing buffers may be implemented by supporting the buffers on elevators 140 shown in dotted lines in FIG. 4, instead of the platforms 132.

The loading systems and the process modules as shown in FIGS. 3-13 typically are manufactured with separate frames, enclosures, and other structural elements. They may then be combined into a processing system having a loading system 100, 180 or 184 and a process module 166. Consequently, any of the loading system shown in FIGS. 3, 4, 6, 8, 10 and 12 may optionally be combined with any one of the process modules 166 as shown in FIGS. 6, 8, 10 and 12. In addition, in any of these combinations, a non-track based robot may be used as a transfer robot. For example, a transfer robot having an articulated arm may be fixed and positioned on a centrally located pedestal in the loading system.

In the loading system 100 shown in FIG. 6, although two transfer robots 152 and 154 are used, the transfer robot 152 accesses only FOUPs F1 and F2 and the first buffer 158. Correspondingly, the second transfer robot 154 accesses only FOUPs F3 and F4 and the second buffer 160. Consequently, each transfer robot 152 and 154 operates only within its own dedicated space. As a result, no cumbersome conflict or collision avoidance software for controlling the transfer robot movements is needed. The transfer robots can therefore move more quickly than robots using conflict avoidance software. A similar result is achieved in the loading systems 180 and 184 shown in FIGS. 8, 10 and 12, since in these designs, only a single transfer robot is used.

Similarly, in the process modules 166 shown in FIGS. 6, 8 and 12, although two process robots 172 and 174 are used, again, each of the process robots operates exclusively within its own space. Specifically, the first process robot 172 typically moves only between the first buffer 158 and the processors 168 on the first side 162, while the second process robot 174 correspondingly typically moves only between the second buffer 160 and the processors 168 on the second side 164. Conflict avoidance control software is therefore also not needed for controlling the process robots 172 and 174. This allows the process robots to operate more quickly. At the same time, the potential for wafer or robot damage caused by collisions resulting from the robots accessing the same spaces is greatly reduced.

FIGS. 14 and 15 are scale drawings showing relative sizes of a three FOUP system 50, as shown in FIGS. 1 and 2, in comparison to an eight FOUP system as shown in FIG. 6, 8, 10 or 12. The three FOUP systems 50 shown in FIG. 14 occupies an area of 7.7 square meters (an 83 square foot footprint) and has a capacity of up to 222 wafers per hour. In contrast, the processing systems 90, 92, 94 or 96, as shown in FIG. 6, 8, 10 or 12, occupies 11.6 square meters (a 125 square foot footprint), with an up to 400 wafer per hour capacity. Consequently, the system 90 provides an approximately 20% increase in wafers processed per hour, per square unit of floor space. Comparing FIGS. 14 and 15, this increase in processing capability is achieved with a relatively small increase in the width of the system. Since the width dimension determines how many processing systems can be placed in a process facility bay, the width is the most critical dimension in terms of space requirements in the manufacturing facility. Length and height are less critical. Hence, the increase in processing capability achieved via the loading systems, with little increase in width, is highly significant.

The width W1 of the processing system 50 shown in FIG. 14 is 1.8 meters, (for a system 50 having a three FOUP capacity). In comparison, the processing system 90 shown in FIG. 15 has a loading system width W3 of 2.4 meters (for an eight FOUP capacity system). This example illustrates a 35% increase in wafers-per-hour per linear unit dimension in width. These dimensions are of course only representative examples, as the loading systems and process modules may have other dimensions and proportions as well.

FIGS. 16-23 show and describe methods for operating any one of the systems 90 shown in FIGS. 6, 8 and 10. FIGS. 16, 18, 20 and 22 show only the loading system 100, 180 or 182, without any process module 166 shown in these figures. These loading systems, as shown in FIGS. 16, 18, 20 and 22, however, may be attached to, and operate with, any of the process modules 166 shown in FIG. 6, 8, or 10, or indeed, with other types of process modules as well.

Figure 16:
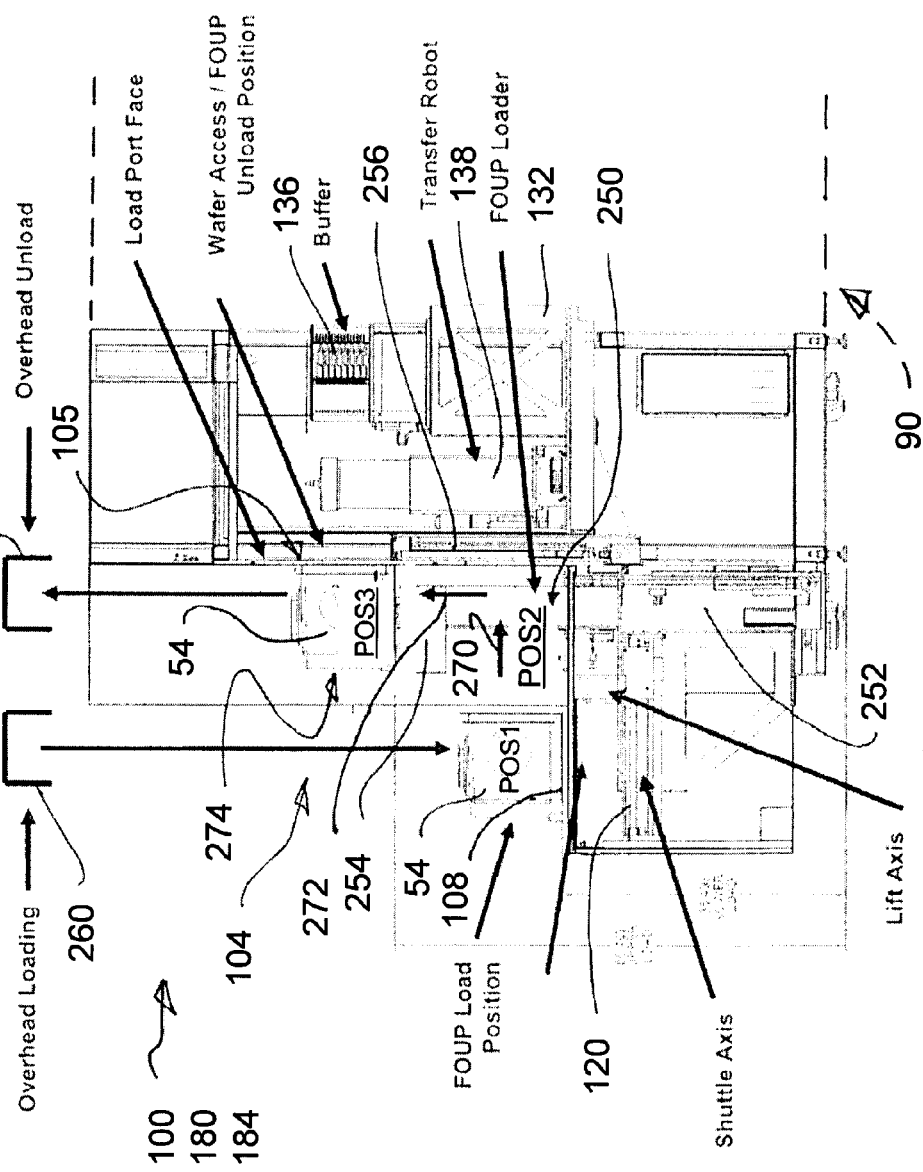
FIG. 16 is a section view of a loading system as shown in FIG. 6, 8, 10 or 12, set up to operate in a shuttle pattern mode.
Figure 17:
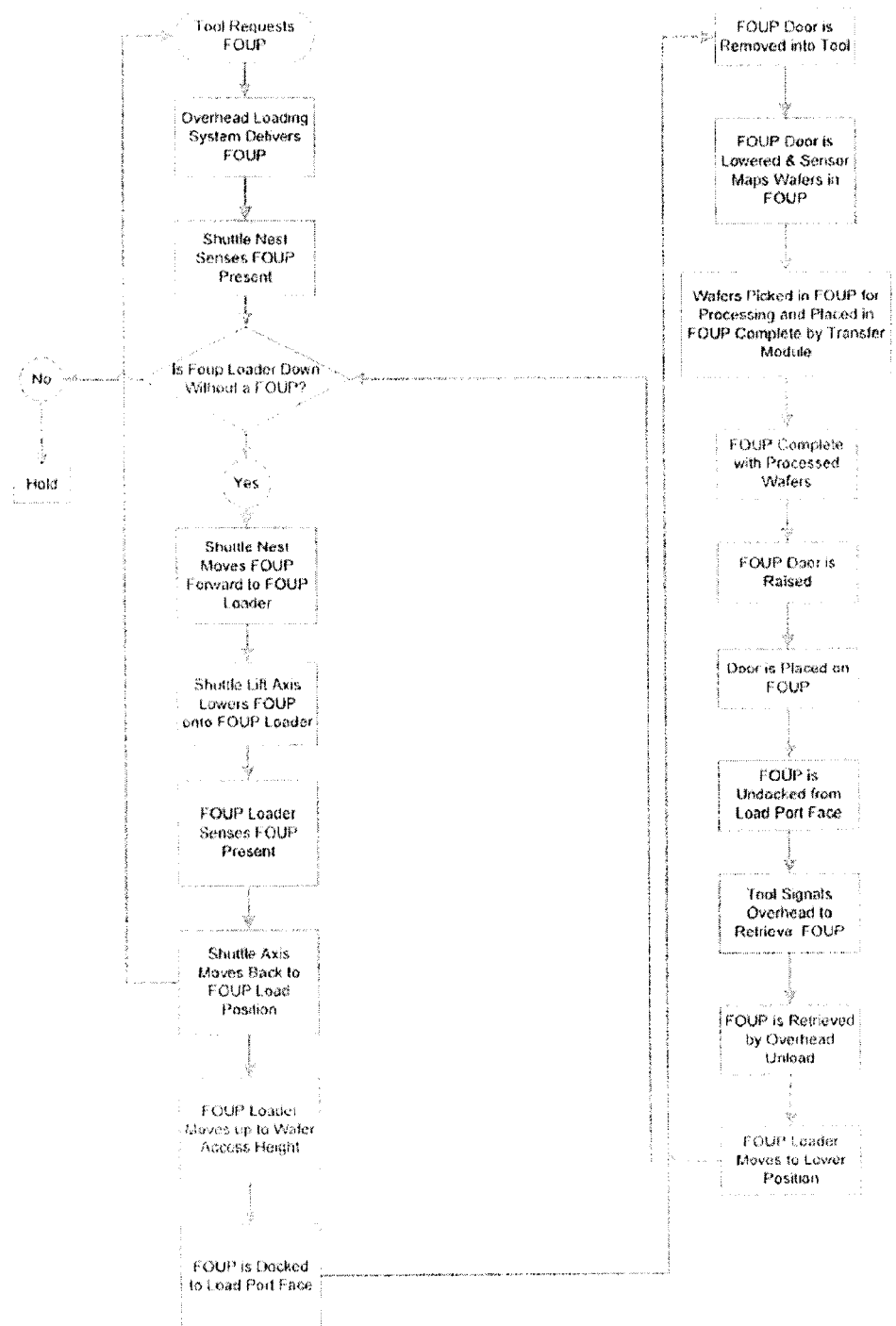
FIG. 17 is a block diagram indicating operation of the system shown in FIG. 16.

FIGS. 16 and 17 show and describe operation of the loading system in an eight FOUP shuttle pattern. The FOUPs 54 are delivered to and removed from the loading system 100, 180 or 184 from first and second overhead loading tracks 260 and 262. The overhead loading tracks 260 and 262 move FOUPs from other locations in the manufacturing facility or fab, to the processing system 90, 92, 94 or 96, generally via computer controlled automation, as is well known in the semiconductor manufacturing field. Cars move along the tracks within the fab. FOUP holders are suspended on cables from the cars and are adapted to engage onto a fitting on top of the FOUP, to lift and lower FOUPs into selected positions, in a crane-like manner. Discussions here to operations of a loading track refer to these components or sub-systems that pick and place FOUPs, as is well known in the semiconductor manufacturing industry.

Referring to FIGS. 16 and 17, in operation, a FOUP 54 is delivered from the first overhead loading track 260 down onto a loader plate 122 in one or more of, and typically in all of, the FOUP columns 110, 112, 114 and 116, in the outer or AA row shown in FIGS. 3 and 16. The loading system then detects whether a FOUP is present and properly positioned on the plate 122, and whether a FOUP loader 250 associated with that plate is in the down position. Once these conditions are detected, the shuttle actuator 120 moves the plate and FOUP inwardly towards the docking wall 106 (in the direction of arrow 270 in FIG. 16). The shuttle actuator 120 then lowers the FOUP onto an associated FOUP loader 250. After the FOUP loader 250 detects a FOUP present, the shuttle actuator 120 reverses direction and moves down slightly, and then rearward from row BB back to its original position at row AA. The lift actuator 252 then lifts the FOUP loader 250 carrying a FOUP, in the direction of arrow 272 up to a wafer access position 274, vertically aligned with a docking opening 105.

A docking actuator 254 then moves the FOUP 54 incrementally further forward into a docked position a docking opening 105 in the docking wall 106. A FOUP door remover 256 then removes the FOUP door from the FOUP and lowers it out of the way. These FOUP movements and events are typically carried out in each of the four FOUP columns.

A transfer robot (of any type used in the loading system) then moves wafers from the docked FOUP to a buffer. Wafers in the buffer are then moved into processors 168, are processed, and then returned to a buffer by a process robot (of any type used in the process module 166), as described above. The transfer robot 138 then returns the processed wafers from the buffer to a FOUP. The FOUP door remover 256 replaces the door onto the FOUP. The docking actuator 254 then undocks the FOUP, by moving it away from the docking wall 106, in the direction opposite to the arrow 270. The processing system controller then signals the second overhead FOUP transport track 262 to pick up the FOUP now holding processed wafers. The second overhead FOUP track 262 then engages and lifts the FOUP up off of the FOUP loader 252, and carries it to the next station in the fab.

The FOUP loader lift actuator 252 then moves back down to the height of the load deck 108, in preparation for receiving another FOUP. In general, the sequence described above is performed in the same way at each of the four FOUP columns 110, 112, 114 and 116, although the movements described are not necessarily performed simultaneously at each FOUP position. Rather, shuttle actuator, FOUP loader, lift actuator, and door remover at each of the four FOUP positions may be controlled by the controller 62 for movement entirely independent of movement of these elements at any other FOUP position.

Alternatively, these elements which facilitate FOUP movement at each of the FOUP positions may controlled in ways that are fully or partially dependent on other factors, such as movement in other FOUP positions. For example, the controller 62 may be programmed so that all four FOUPS are moved in the same way, at the same time. Staggered FOUP movements may also be used. In addition, the FOUP movement pattern can be reversed, with FOUPs delivered to row BB by track 262, and removed from row AA by track 260.

For purpose of illustration, in FIG. 16, the FOUP 54 is shown in three sequential positions. The first position, labeled POS1, shows the FOUP in drawn in solid lines. The second position, labeled POS2, is empty in FIG. 16. The third position, labeled POS3, again shows the same FOUP 54 in solid lines. The small movements performed in handing off the FOUP from the shuttle actuator to the FOUP loader, and in docking/undocking the FOUP, are not shown. For purpose of description, POS 2 includes the FOUPs horizontal position, regardless of whether the FOUP is supported by the shuttle actuator or the FOUP loader. Similarly, POS3 includes the FOUPs horizontal position regardless of whether the FOUP is docked or undocked.

Referring to FIGS. 3 and 16, the description of the FOUP positions POS1, POS2 and POS3 above applies at each of the FOUP columns or aisles 110, 112, 114 and 116. For purpose of description then, POS1, POS2 and POS3 may be considered as being in e.g., FOUP column 110. The equivalent positions in FOUP column 112, relative to the design in FIG. 16, would then be positions 4, 5 and 6, referred to as POS4, POS5 and POS6, respectively. Similar position descriptors may be used as well for columns 114 and 116.

Figure 18:
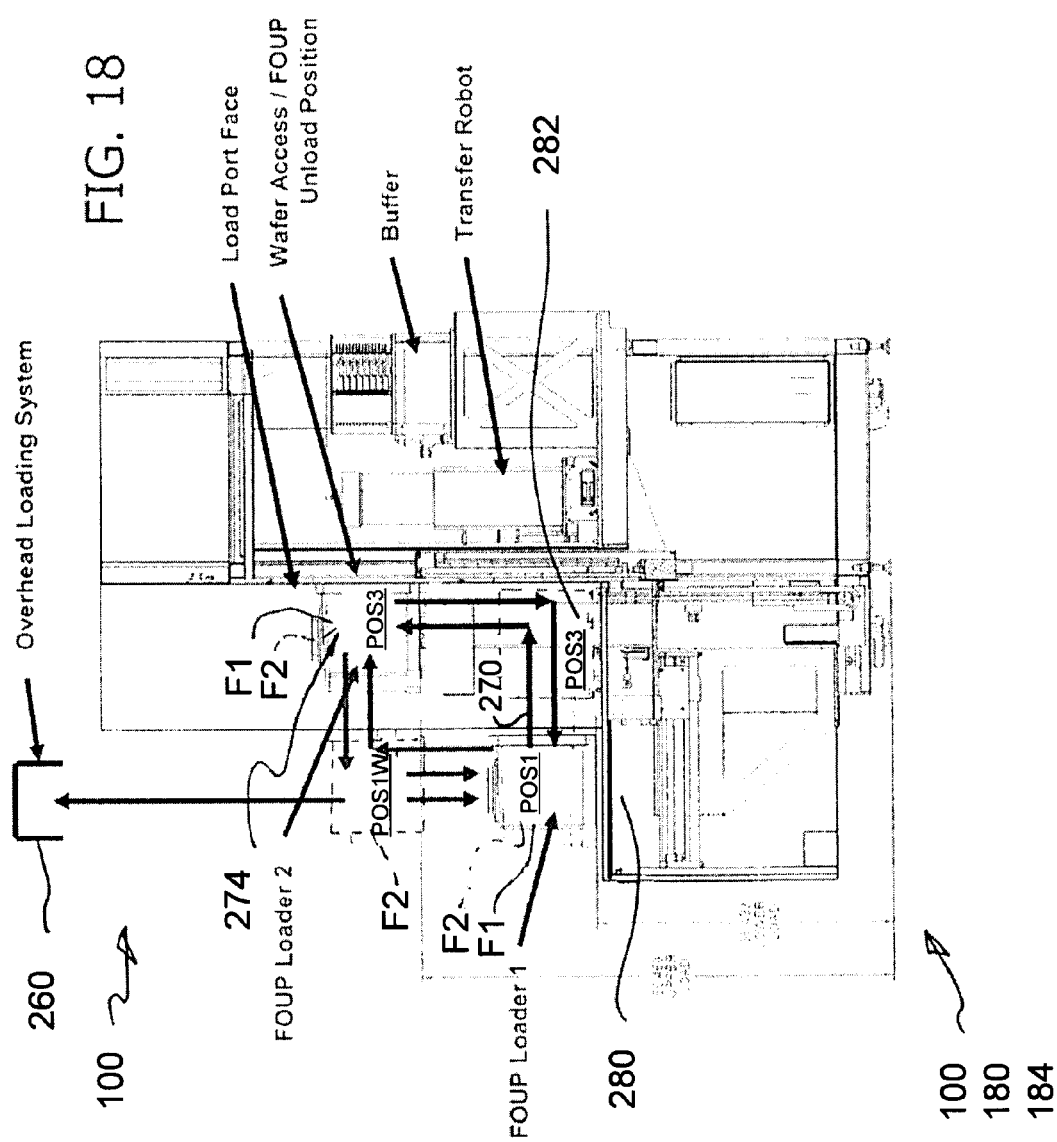
FIG. 18 is a section view of a loading system as shown in FIG. 6, 8, 10 or 12 set up to run in a swap pattern mode.
Figure 19:
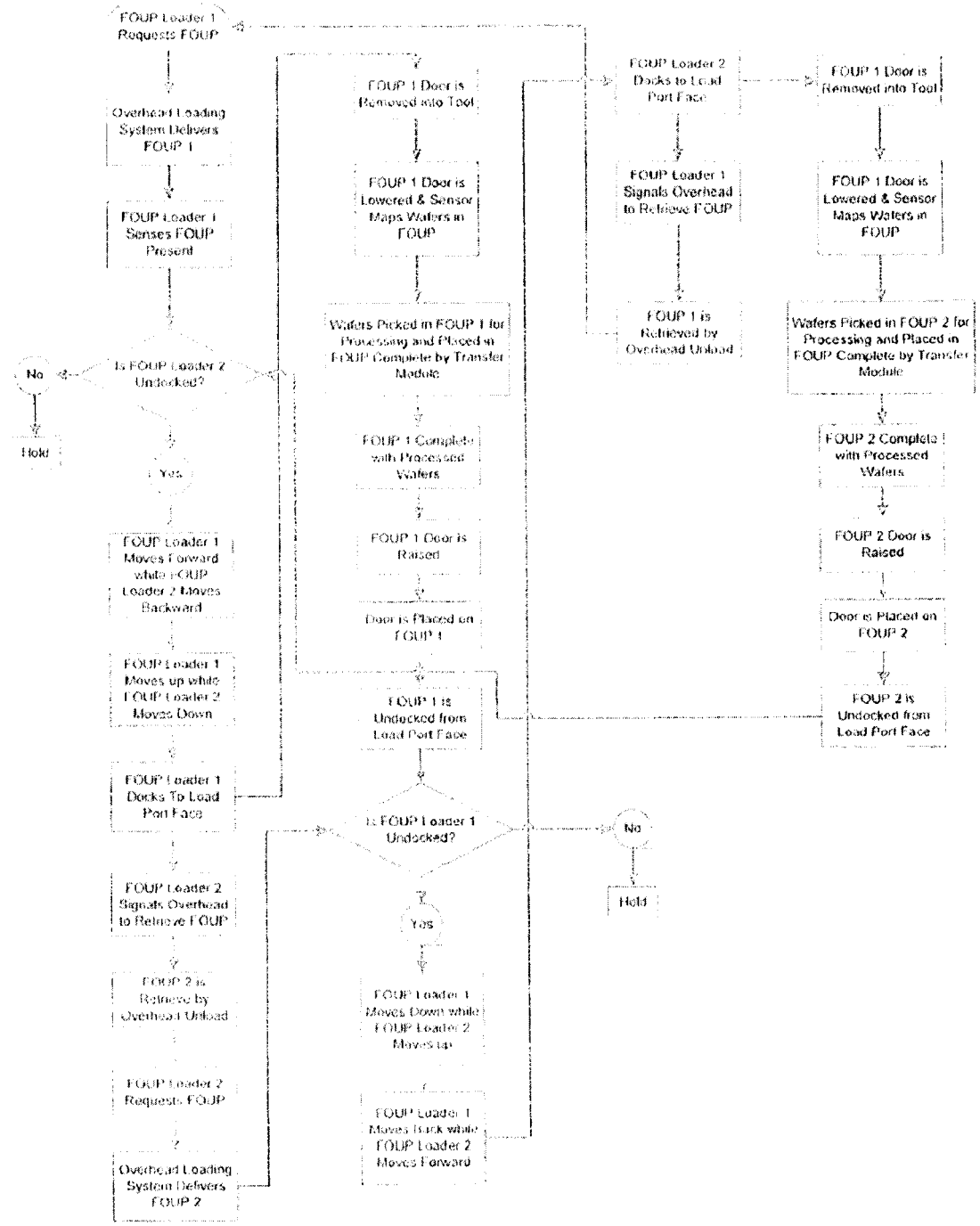
FIG. 19 is a block diagram indicating operation of the system shown in FIG. 18.

FIGS. 18 and 19 show operation of a loading system using an eight FOUP swap pattern. This design uses a first FOUP loader 280, a second FOUP loader 282, and a single overhead loading track 260. The FOUP loaders 280 and 282 perform both horizontal and vertical movements. In operation, the plate 122 of the first loader 280 is at POS1 and the plate 122 of the second loader 282 is at POS3. The single overhead track 260 lowers a first FOUP F1 onto the plate 122 of the first FOUP loader 280, at POS1 in FIG. 18. The first FOUP loader 280 moves forward (in the direction of arrow 270 in FIG. 18), carrying the FOUP F1 from position POS1 to position POS2. The second FOUP loader 282 moves rearward from POS3 to an intermediate position POS1W above POS1 and at the same vertical height as POS3. Then the first FOUP loader 280 then moves up, carrying the first FOUP F1 from POS2 to POS3, i.e., from the height of the load deck 108, to the wafer access position 274. The second FOUP loader 282 moves down, to the position POS1 originally occupied by the first FOUP loader 280. The first FOUP loader 280 then moves the first FOUP F1 further forward, to dock the FOUP F1 at an opening 105 of the docking wall 106.

The wafers in the first FOUP F1 are then removed, processed and returned to FOUP F1, as described above. The door remover 256 removes and replaces the door onto FOUP F1. The first FOUP loader 280 undocks the first FOUP F1. In the interim, the overhead loading track 260 has delivered a second FOUP F2 onto the second FOUP loader 282 at POS1. The first FOUP loader 280 moves FOUP F1 back down to POS2, while the second FOUP loader 282 moves the second FOUP F2 up from POS1 to POS1W.

The first FOUP loader 280 then moves rearward, carrying the first FOUP F1 from POS2 back to POS1 (to its original position). The second FOUP loader 282 moves the second FOUP F2 forward from POS2 to POS3, which is the wafer access position 274. The second FOUP loader 280 then docks the second FOUP F2. The door of FOUP F2 is removed and the wafers in FOUP F2 processed and returned, as described above relative to FOUP F1. FOUP F1, in the interim, is picked up by the overhead loading track 260 and moved to a subsequent processing or storage location within the fab facility. Of course, the sequence of FOUP movements may be reversed, with the first FOUP loader 280 moving up and then forward, and the second FOUP loader first moving down and then back. The FOUP movements described above and shown in FIG. 18 may be performed simultaneously to allow for simpler actuating mechanisms. However, simultaneous movement is not required.

Figure 20:
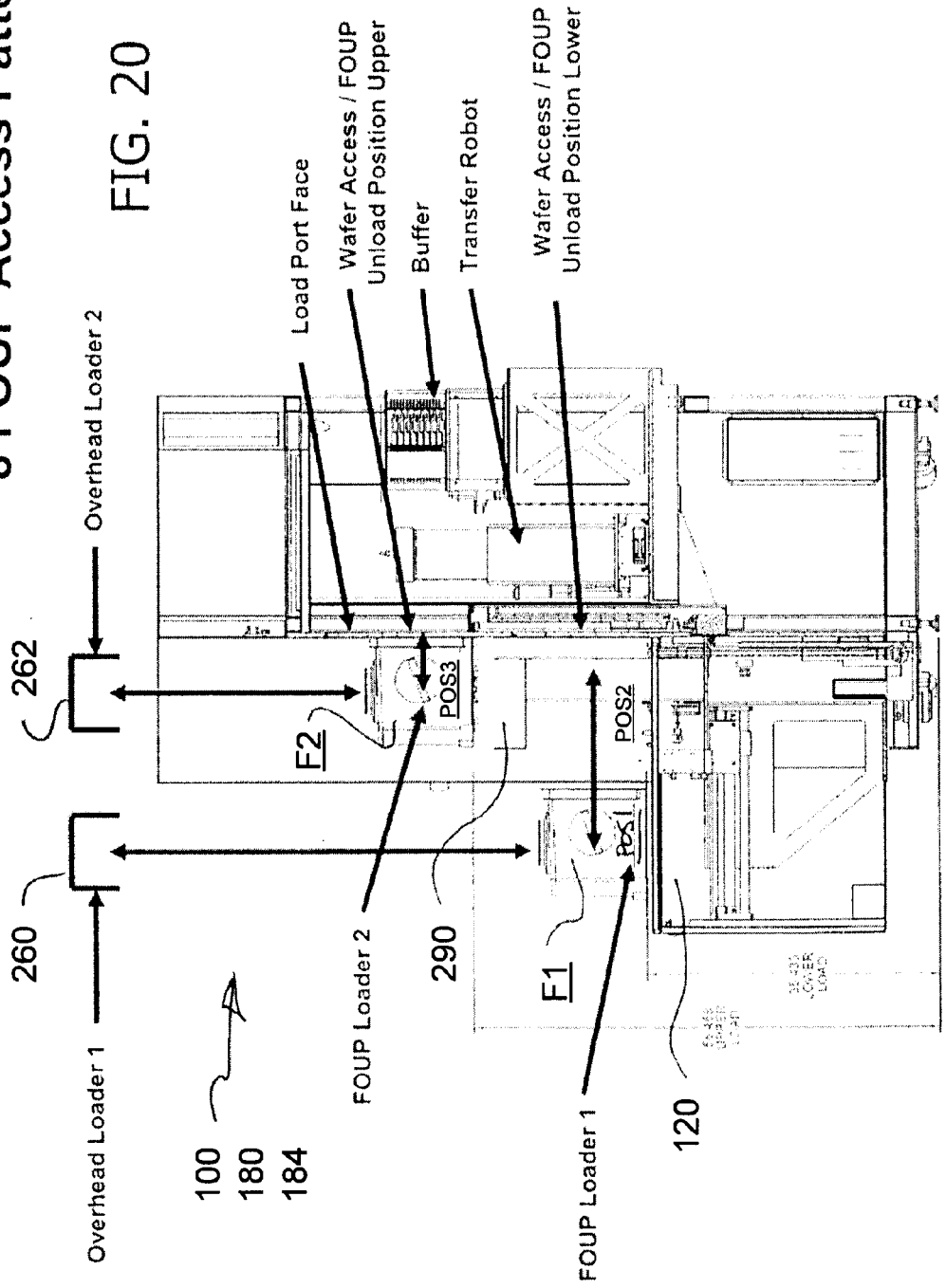
FIG. 20 is a section view of a loading system as shown in FIG. 6, 8, 10 or 12 set up to run in an access pattern mode.
Figure 21:
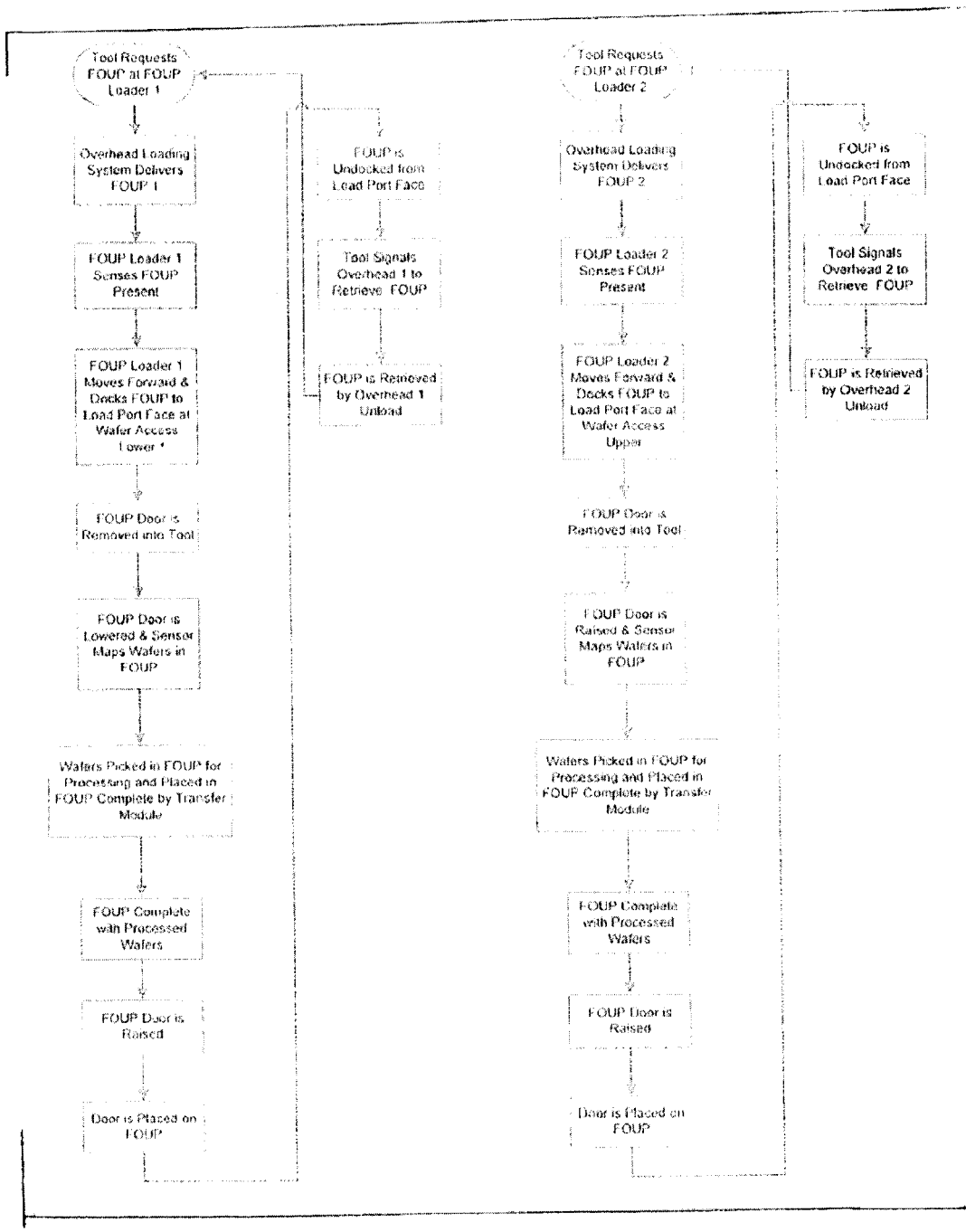
FIG. 21 is a block diagram indicating operation of the system shown in FIG. 20.

FIGS. 20 and 21 show an alternative design using two overhead loading tracks 260 and 262, and two actuator shuttles 120, but without the need for any vertical FOUP movement provided by a FOUP loader. Rather, in the design of FIGS. 20 and 21, all of the vertical FOUP movement is provided by the overhead loading tracks 260 and 262. In the loader shown in FIG. 20, eight docking openings are provided. Four lower docking openings 107 are provided at or near the level of the load deck 108, and four upper docking openings 105 are provided at the wafer access position 274. A representative lower docking opening 107 is shown in dotted lines in FIG. 3. After the overhead loading tracks 260 and 262 place a FOUP onto a FOUP plate 122 of a shuttle actuator 120, no vertical FOUP movement is needed to dock the FOUP.

Referring to FIG. 21, the first overhead loading track 260 lowers a first FOUP F1 onto a FOUP plate 122 at POS1 of a first actuator shuttle 120. The actuator shuttle 120 then moves the FOUP F1 forward, from POS 1 to POS2, docking the FOUP F1 at a lower docking opening 107. The door of FOUP F1 is removed, the wafers held in FOUP F1 are removed, processed, returned to FOUP F1, and the door replaced. The first actuator shuttle 120 then undocks the FOUP and moves it rearwardly from POS2 back to its original POS1 position. The first overhead loading track 260 then removes the FOUP F1.

Referring to FIGS. 20 and 21, the second overhead loading track 262 lowers a second FOUP F2 into POS3, onto a docking actuator 290, positioned vertically above the first shuttle actuator 120, at the level of an upper docking opening 105. The docking actuator 290 then docks the second FOUP F2 at an upper docking opening 105. The door of FOUP F2 is removed, the wafers in F2 unloaded, processed and replaced into FOUP F2, and then the door of F2 is replaced. The docking actuator 290 reverses direction, undocking the second FOUP F2. The second overhead loading track 262 then removes the second FOUP F2. The only movement required of the docking actuator 290 is the small forward movement used for docking the FOUP.

Referring to FIGS. 3 and 20, third and fourth FOUPs may be handled in the same way. Since this design has 8 docking openings, and since a FOUP may be docked any docking opening independent of the position of any other FOUP on the loading system, all 8 FOUPS may be docked at the same time. Accordingly, if desired, the transfer robot(s) in the system of FIG. 20 can access any one of 8 docked FOUPs.

Figure 22:
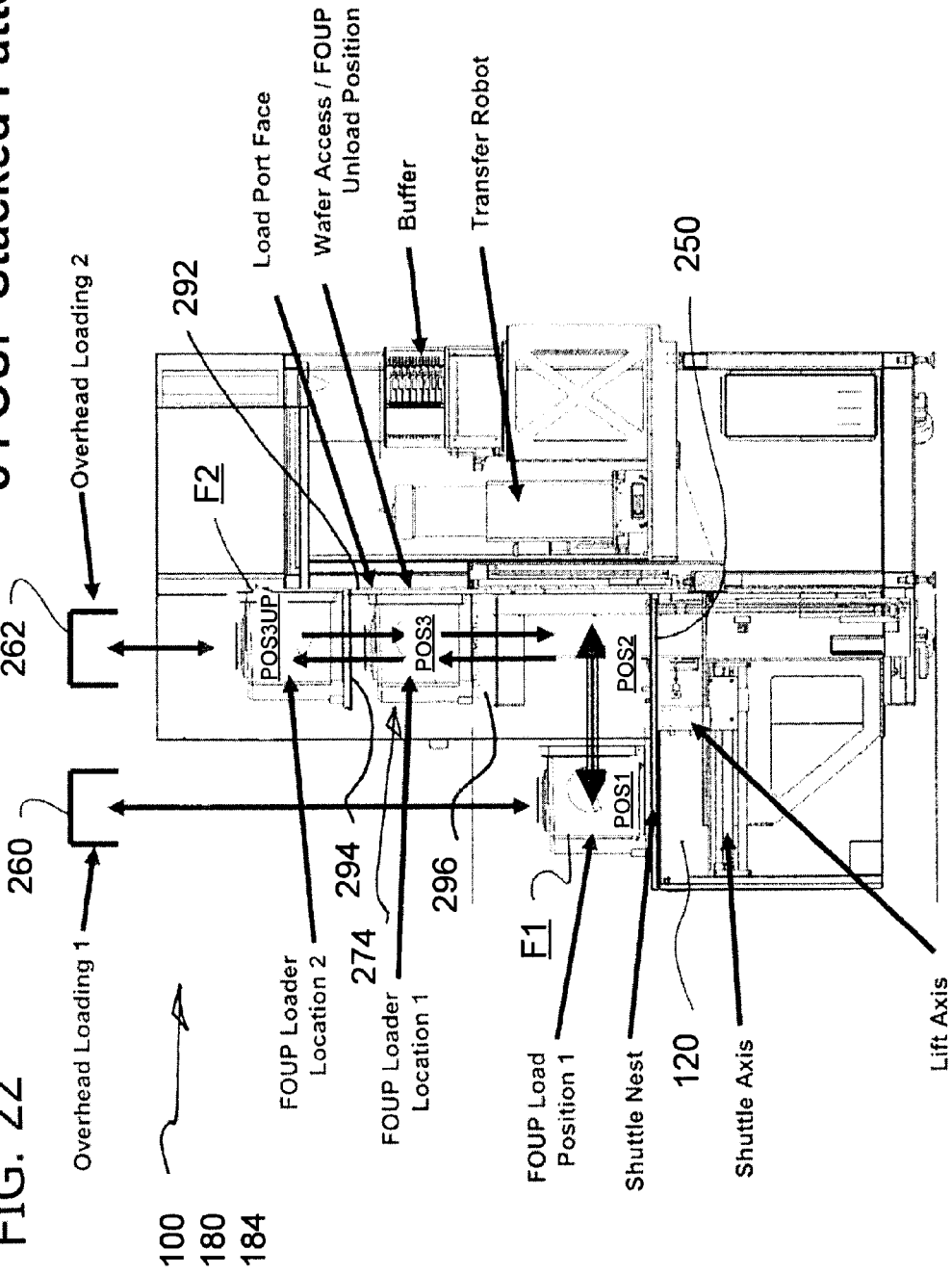
FIG. 22 is a section view of a loading system as shown in FIG. 6, 8, 10 or 12 set up to run in a stacked pattern mode.
Figure 23:
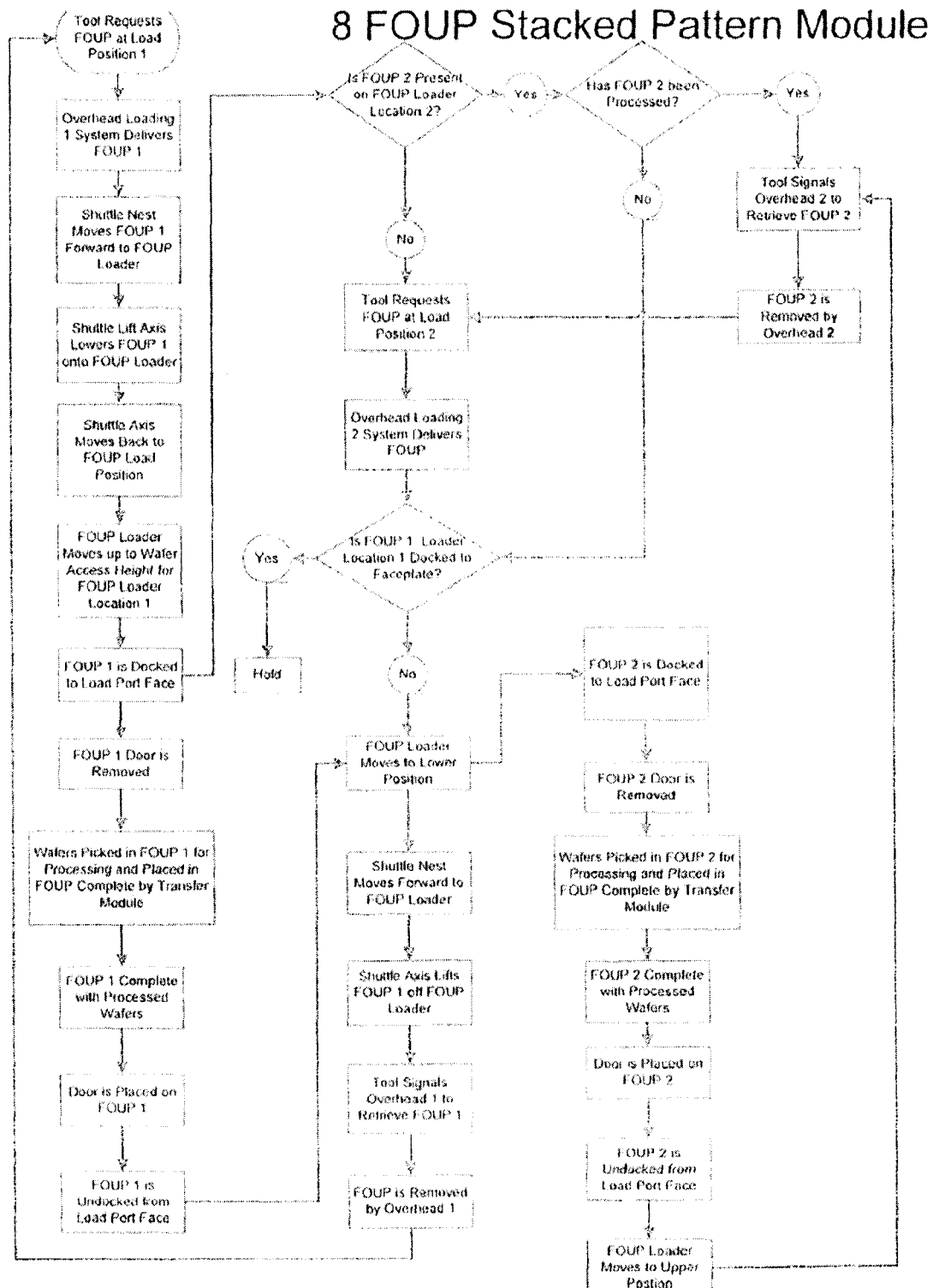
FIG. 23 is a block diagram indicating operation of the system shown in FIG. 22.

FIGS. 22 and 23 show another alternative method of operation of a loading system, such as systems 100, 180 or 184. This operation uses first and second overhead loading tracks 260 and 262, a single shuttle actuator 120, and a single two level or stacked FOUP loader 292. The FOUP loader 292, however, has an upper FOUP plate 294 stacked vertically above a lower FOUP plate 296, with a docking actuator associated with each of the plates 292 and 294. Referring to FIGS. 22 and 23, the first or outer load track 260 lowers a first FOUP F1 into POS1 on the FOUP plate 122 of a shuttle actuator 120, at the load deck 108. The first FOUP F1 is then moved onto the lower FOUP plate of the FOUP loader 292 from POS1 to POS2, then lifted up to POS3, docked, and opened, in the same way as in FIG. 16, as described above. The wafers then move sequentially to a buffer, a processor, back to a buffer, and then back into a FOUP, via transfer and process robots.

While the first FOUP F1 is at the POS 3 wafer access position 274, or docked at a docking opening 105, the second overhead loading track 262 delivers a second FOUP F2 onto the upper plate 294 of the FOUP loader 292. This position, referred to here as the stack position, is labeled as POS3UP in FIG. 22. The stack position is above the wafer access position 274, as shown in FIG. 22. The FOUP loader 292 is now holding both the first FOUP F1 at POS3 and the second FOUP F2 at POS3UP. The FOUP loader then moves down, bringing the first FOUP F1 back down to POS2, substantially at the load deck level, and simultaneously lowers the second FOUP F2 down from POS3UP to the POS3 wafer access position 274. The second FOUP F2 is then docked and opened, with wafers in the second FOUP F2 handled, processed and returned, in the same way as with FOUP F1 described above. The shuttle actuator 120 in the interim has removed FOUP F1 from the lower plate 296 of the loader 292 and returned FOUP F1 from POS2 back to its original position at POS1. The first overhead track 260 then removes FOUP F1 and carries it to a subsequent processing or storage location within the fab. After processed wafers are returned to FOUP2, and the door reinstalled, FOUP2 is undocked, and lifted off of the processing system via the second overhead track 262.

In each of the designs described above, processed wafers may be returned to their original FOUP, or they may be returned to a different FOUP, depending on the processing carried out, and other factors. Similarly, the process robot(s) and/or the transfer robot(s) may handle both unprocessed and processed wafers using the same end effector, or using a different end effector. In particular, in some designs, unprocessed wafers may be handled only by dedicated unprocessed wafer end effectors, while processed wafers are handled only by dedicated processed wafer end effectors, to reduce potential for cross contamination.

As is apparent from the description above, the methods described may be performed using many different types of apparatus, as the methods are directed to the movements and sequences of events, and not to apparatus providing such movements and sequences of events. The specific elements described relative to FIGS. 16-22 are mere examples of apparatus. The types and numbers of transfer and process robots may also be changed as may be desired. While the drawings show 8 FOUP loading systems, the inventive concepts described here may also be used with loading systems having 2, 3, 4, 5, 6, 7, 8, 9, 10, 11, 12 or more FOUP positions.

The number and type of buffers used may also be varied. In addition, in certain applications, buffers and transfer robots may be entirely omitted, with one or more process robots performing all wafer handling and movement. In some applications, the buffers may optionally be moved laterally, via lateral buffer actuators, along with, or in place of, vertically moving indexing buffers, or fixed buffers. While each of the robots described above (except for the 5-wafer robot 202 in FIG. 12) is used with an end effector adapted to handle a single wafer, other types of end effectors for handling differing numbers of wafers, such as 2, 3, 4, 5, 6 or more, may also be used.

In each of the designs described above, processed wafers may be returned to their original FOUP, or they may be returned to a different FOUP, depending on the processing carried out, and other factors. In some fabs, the unprocessed wafers may be delivered to the loading system in a so-called "dirty" FOUP. After processing, the "clean" wafers are then returned to a different "clean" FOUP (referred to here as an "auxiliary" FOUP), typically docked at a docking opening 105 different from the docking opening at which the "dirty" FOUP was docked. The loading system 100 as described above may operate in this way, with the transfer robot(s) controlled to pick unprocessed wafers from one FOUP and return them after processing to a different FOUP. Similarly, the process robot(s) and/or the transfer robot(s) may handle both unprocessed and processed wafers using the same end effector, or using a different end effector. In particular, in some designs, unprocessed wafers may be handled only by dedicated unprocessed wafer end effectors, while processed wafers are handled only by dedicated processed wafer end effectors, to reduce potential for cross contamination.

The term work piece or wafer here means any flat article, including semiconductor wafers and other substrates, such as glass, mask, and optical or memory media, MEMS substrates or any other work piece having, or on which, micro-electronic, micro-mechanical, micro-electro-mechanical, or micro-optical devices, may be formed. Although operations using FOUPs has been described, other types of containers or carriers may alternatively be used. Terms such as "forward", "rearward", "upper", "lower", and the like when used here refer to the positions of the respective elements shown in the drawing figures, although the invention is not necessarily limited to such positions or relationships. Indeed, the sequences of movements described may generally be reversed to perform equivalent steps or methods. Similarly, terms such as "vertical", "inwardly", "outwardly", "towards", "away from", and similar terms, as used here mean "in the general direction of", and not limited to their geometric definitions. The term "between" here includes movement entirely into the endpoints, such as into a carrier, a buffer or a processor.

Thus, novel methods and apparatus have been shown and described. Various changes and substitutions of equivalents may of course be made, without departing from the spirit and scope of the invention. The invention, therefore, should not be limited, except to the following claims, and their equivalents.

The invention claimed is:

1. A processing system comprising:
   a docking wall having a plurality of docking openings;
   a carrier loading system on a first side of the docking wall, with the carrier loading system having:
      first and second adjacent rows of carrier loading positions at a loading deck level;
      with the first row accessible by a first overhead loading system, for lowering a carrier into a loading position in the first row;
      a shuttle actuator positioned to move a carrier to or from a position in the first row to or from a position in the second row;
      a carrier loader positioned to receive a carrier from the shuttle actuator, at the second row;
      a lift actuator linked to the carrier loader for lifting and lowering the carrier loader;
   at least one robot on a second side of the docking wall, opposite from the first side;
   at least one processing chamber accessible by the robot; and
   the second row of carrier loading positions accessible by a second overhead loading system, for removing the carrier from the lift actuator, wherein the second row of carrier loading positions is in between the first row of carrier loading positions and the docking wall.

2. The system of claim 1 wherein each of the rows has two or more carrier columns, and further comprising a shuttle actuator, a carrier loader, a lift actuator, and a docking opening associated with each of the carrier columns.

3. A processing system comprising:
   a docking wall having a plurality of docking openings;
   a carrier loading system on a first side of the docking wall, with the carrier loading system having:
      a first row of carrier loading positions accessible by an overhead load/unload track system, and a second row of carrier loading positions in between the first row of carrier loading positions and the docking wall;
      a shuttle actuator positioned to move a carrier from a position in the first row to a position in the second row;
      a first carrier loader having a first lift actuator;
      a second shuttle actuator, with the second shuttle actuator adapted to receive a carrier from the first lift actuator and to move the carrier away from the docking wall to a position over the first row of carrier loading positions, for removal via the overhead load/unload track system, in a direction opposite to movement of the first shuttle actuator;
   at least one robot on a second side of the docking wall, opposite from the first side; and
   at least one process chamber accessible by the robot.

4. The system of claim 3 wherein each of the rows has two or more carrier columns, and further comprising a shuttle actuator, a carrier loader, a lift actuator, and a docking opening associated with each of the carrier columns.

5. A processing system comprising:
   a docking wall having upper and lower rows of docking openings spaced vertically apart by a dimension DD;
   a carrier loading system on a first side of the docking wall, with the carrier loading system having:
      a first row of carrier loading positions accessible by a first overhead track loading system, and a second row of carrier loading positions between the docking wall and the first row of carrier loading positions;
      a carrier loader having upper and lower carrier holding plates, with the upper carrier plate accessible by a second overhead track loading system, and with the upper and lower carrier plates spaced vertically apart by dimension DD;
      an upper docking actuator attached to the upper carrier plate and a lower docking actuator attached to the lower carrier plate;
      a lift actuator connected to the carrier loader for lifting and lowering the carrier loader;
      a shuttle actuator adapted to move a carrier from the first row onto the lower carrier holding plate;
   at least one robot on a second side of the docking wall, opposite from the first side; and
   at least one process chamber accessible by the robot.

6. The system of claim 5 wherein the first and second rows each have at least two carrier positions.

7. A processing system comprising:
   a docking wall having upper and lower rows of docking openings;
   a carrier loading system on a first side of the docking wall, with the carrier loading system having:
      first and second rows of carrier positions on the carrier loading system, with at least one of the first and second rows of carrier positions accessible by at least one overhead loading track, and with the second row of carrier positions between the docking wall and the first row of carrier positions;
      at least one actuator positioned to move a first carrier from the first row or the second row to a docking opening;
   a first buffer and a second buffer;
   at least one transfer robot movable to carry a wafer from a carrier to the first and/or second buffers; and
   a process module including:
      a first row of process chambers;
      a first robot movable to carry a wafer between the first buffer and a process chamber in the first row of process chambers;
      a second row of process chambers;
      a second robot movable to carry a wafer between the second buffer and a process chamber in the second row of process chambers; and a dividing wall separating the first and second row of process chambers.

8. A processing system comprising:

a docking wall having an upper row and a lower row of docking openings;

a carrier loading system on a first side of the docking wall, with the carrier loading system having:

first and second parallel rows of carrier loading positions, with the second row of carrier loading positions vertically above the first row of carrier loading positions, and with the second row of carrier loading positions in between the first row of carrier positions and the docking wall;

a first overhead loading system, for lowering a carrier into and lifting a carrier from, a loading position in the first row;

a second overhead loading system, for lowering a carrier into and lifting a carrier from, a loading position in the second row;

with the second row of carrier loading positions located adjacent to the upper row of docking openings, to support a carrier for docking at a docking opening in the upper row of docking openings;

a shuttle actuator positioned to move a carrier to or from a position in the first row to or from a position under the second row;

at least one robot on a second side of the docking wall, opposite from the first side; and at least one processing chamber accessible by the robot.

* * * * *